United States Patent [19]
Dirksen et al.

[11] Patent Number: 5,674,650
[45] Date of Patent: Oct. 7, 1997

[54] METHOD OF REPETITIVELY IMAGING A MASK PATTERN ON A SUBSTRATE, AND APPARATUS FOR PERFORMING THE METHOD

[75] Inventors: Peter Dirksen; Jan E. Van Der Werf, both of Eindhoven, Netherlands

[73] Assignee: U.S. Philips Corporation, New York, N.Y.

[21] Appl. No.: 509,909

[22] Filed: Aug. 1, 1995

[30] Foreign Application Priority Data

Aug. 2, 1994 [EP] European Pat. Off. ............. 94202240
Feb. 20, 1995 [EP] European Pat. Off. ............. 95200399

[51] Int. Cl.$^6$ .......................................... G03F 9/00
[52] U.S. Cl. ................. 430/22; 430/394; 356/401
[58] Field of Search ................ 430/22, 5; 356/401; 359/24, 53

[56] References Cited

U.S. PATENT DOCUMENTS

| | | | |
|---|---|---|---|
| 4,251,160 | 2/1981 | Bouwhuis et al. | 356/401 |
| 4,356,392 | 10/1982 | Wittekoek et al. | 250/201 |
| 4,778,275 | 10/1988 | Van Den Brink et al. | 356/401 |
| 5,144,363 | 9/1992 | Wittekoek et al. | 355/53 |
| 5,191,200 | 3/1993 | Van Der Werf et al. | 250/201.4 |
| 5,538,819 | 7/1996 | DeMarco et al. | 430/5 |

OTHER PUBLICATIONS

R. Pforr et al, "in–process Image Detecting Technique for Determination of Overlay and Image Quality for ASM-L Wafer Stepper", SPIE vol. 1674, Optical/Laser Microlighography V, 1992, pp. 594–608.

J. Wangler et al, "Design principles for an illumination system using an excimer laser as a light source", SPIE vol. 1138, 1989, pp. 129–136.

*Primary Examiner*—S. Rosasco
*Attorney, Agent, or Firm*—Arthur G. Schaier

[57] ABSTRACT

A method and apparatus for repetitively imaging a mask pattern (C) on a substrate (W) are described. The focusing of the projection lens system used for imaging and various other parameters of the apparatus and the projection lens system (PL), as well as illumination doses can be measured accurately and reliably, and measuring devices of the apparatus can be calibrated, by measuring an image of a new asymmetrical test mark formed in the photoresist on the substrate (W) by means of a projection beam (PB).

26 Claims, 16 Drawing Sheets

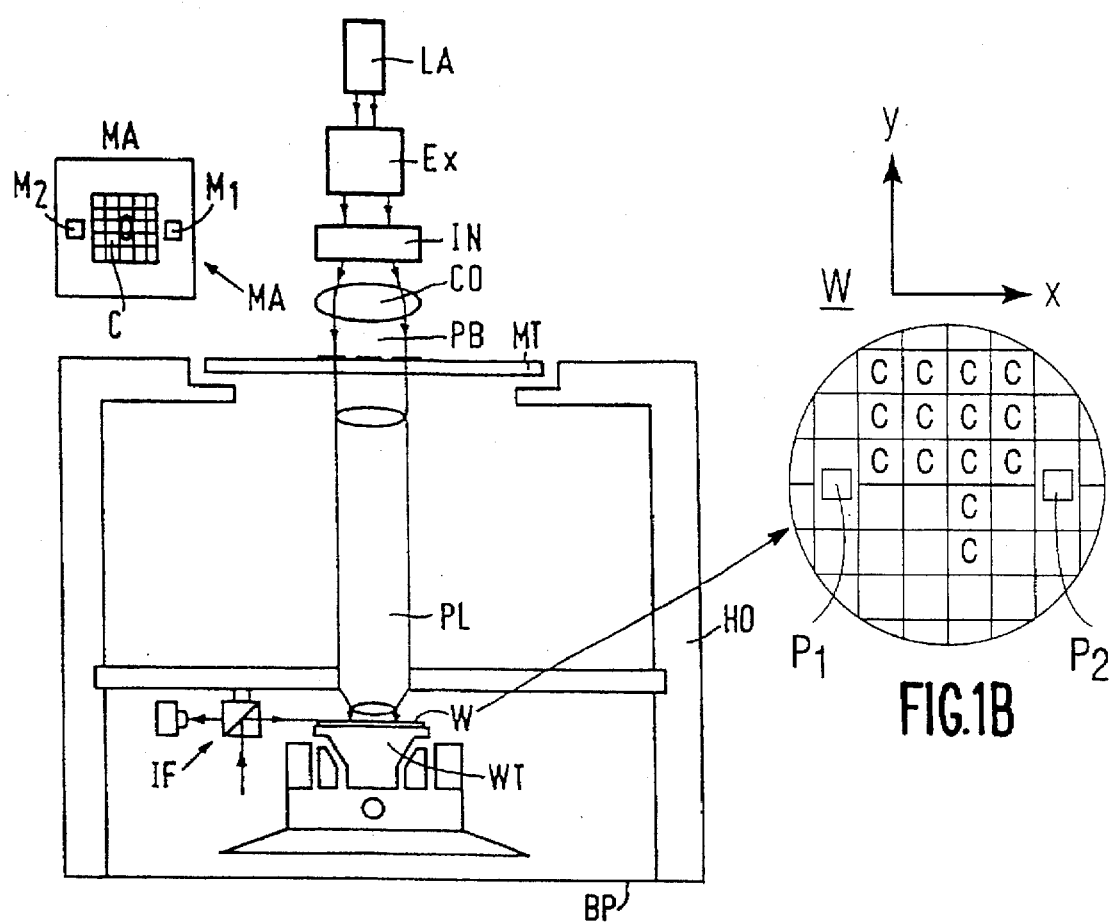
FIG.1A
FIG.1B
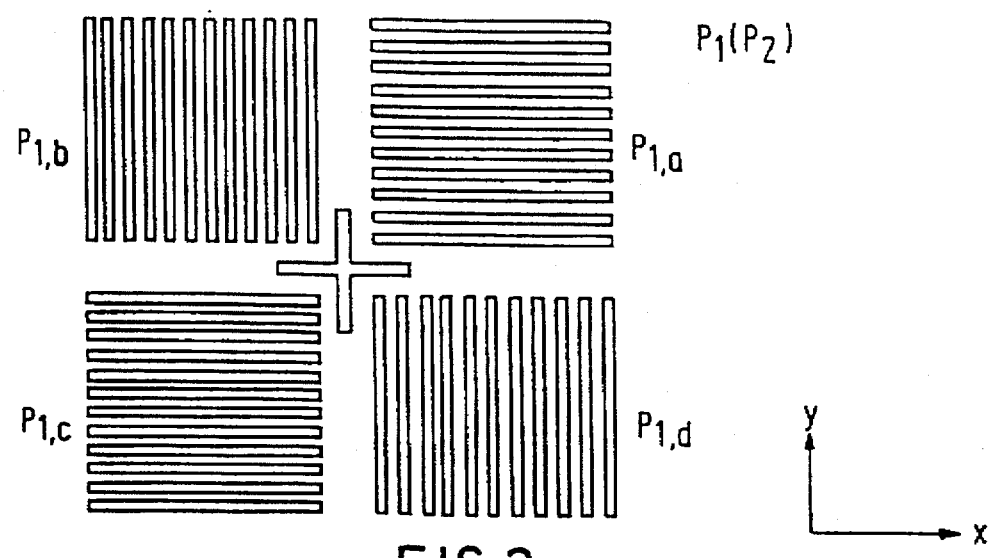
FIG.2

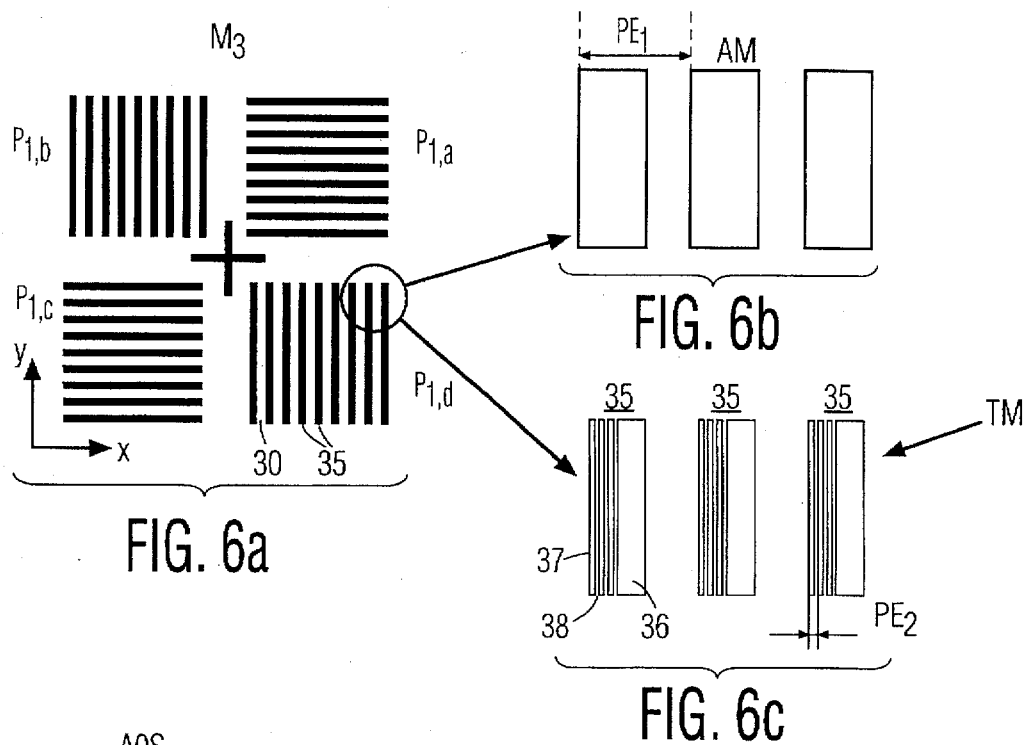
FIG. 6a
FIG. 6b
FIG. 6c
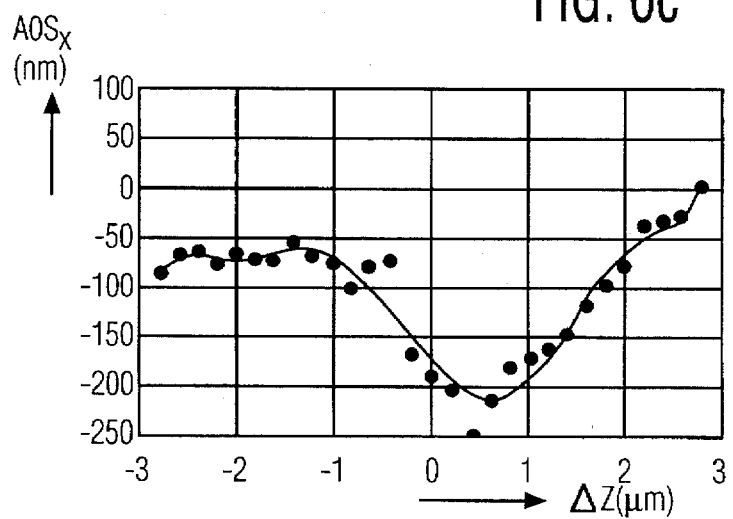
FIG. 7a
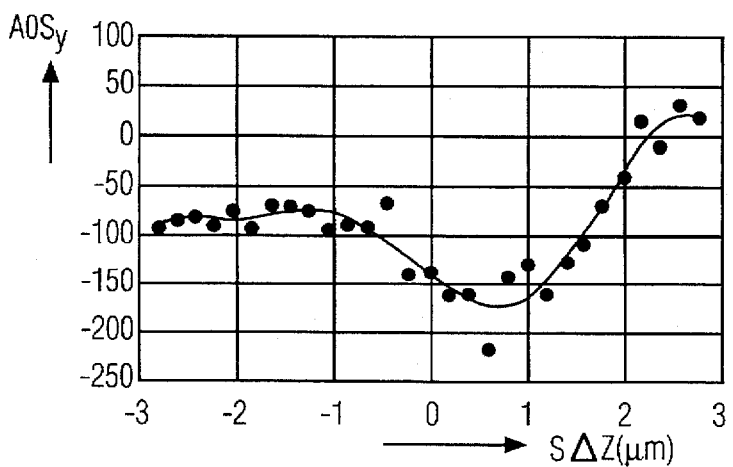
FIG. 7b

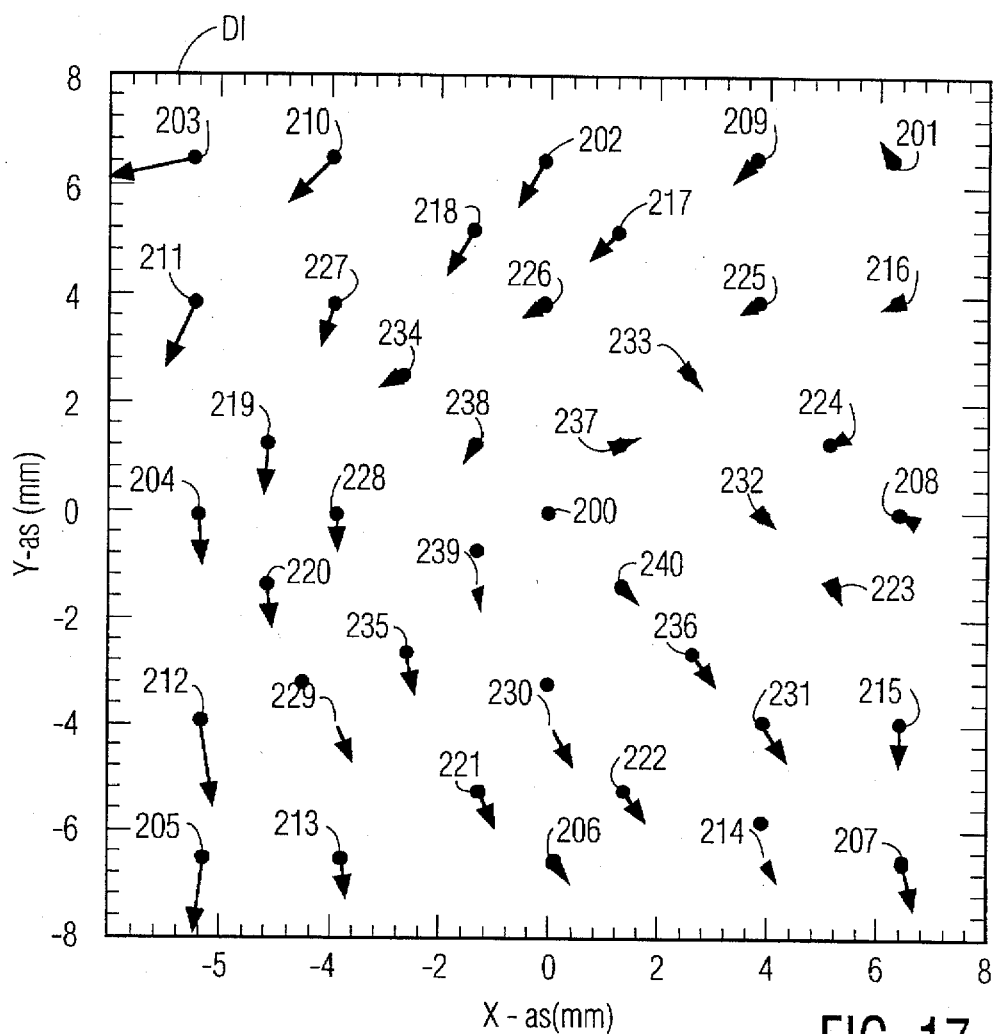
FIG. 17
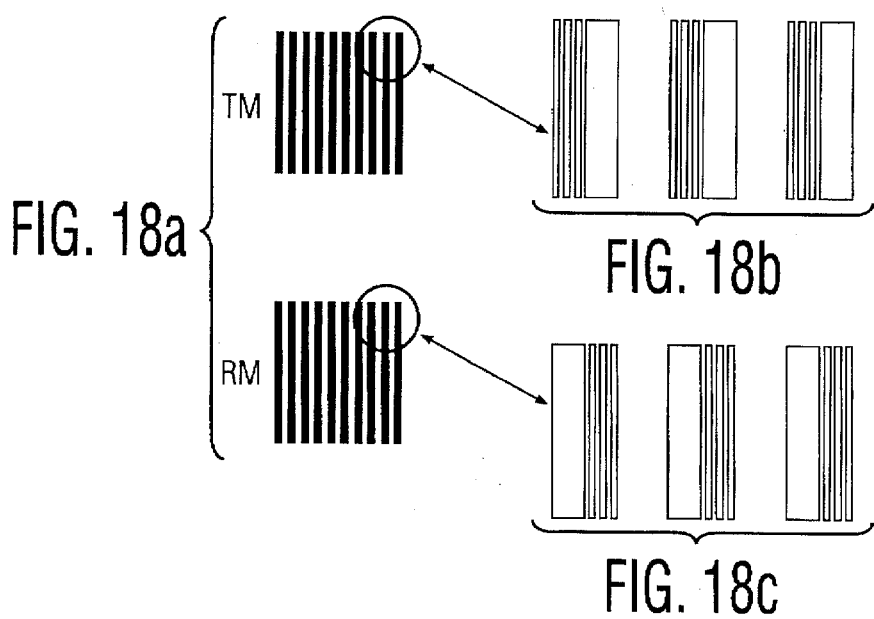
FIG. 18a
FIG. 18b
FIG. 18c

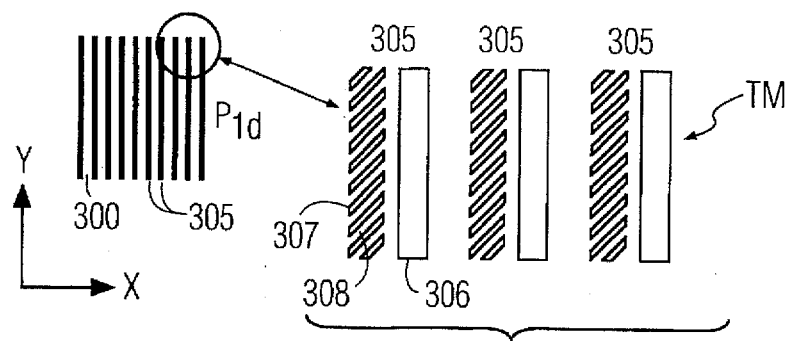
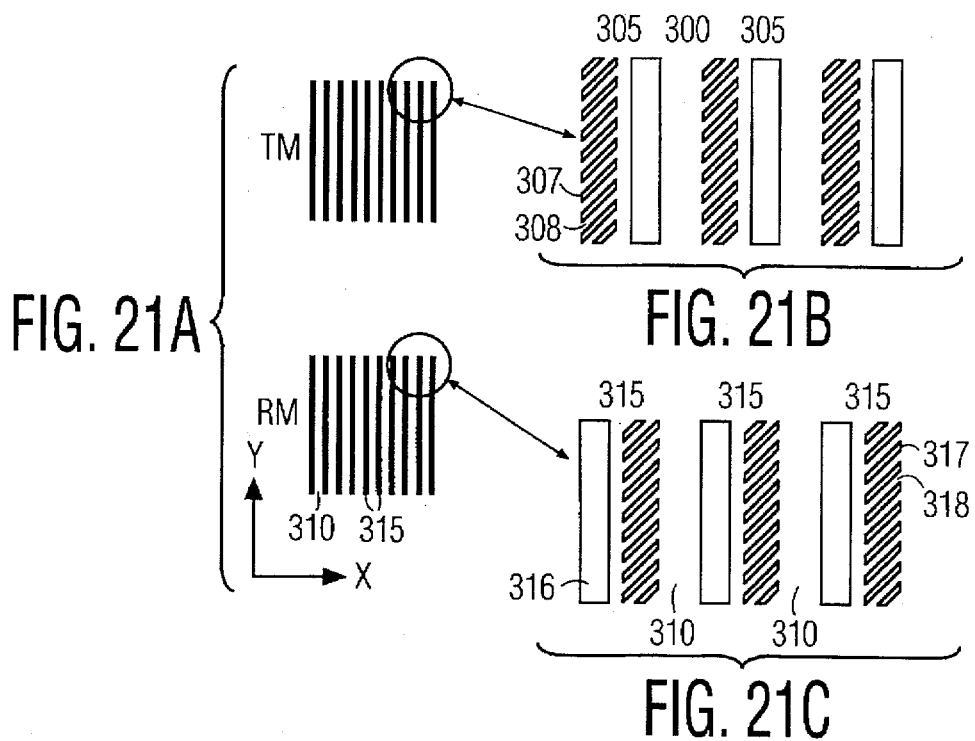
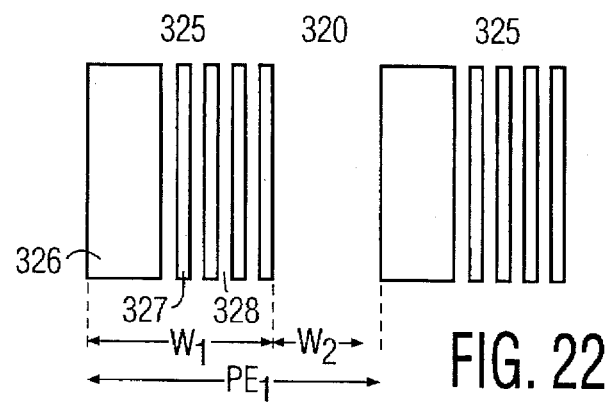

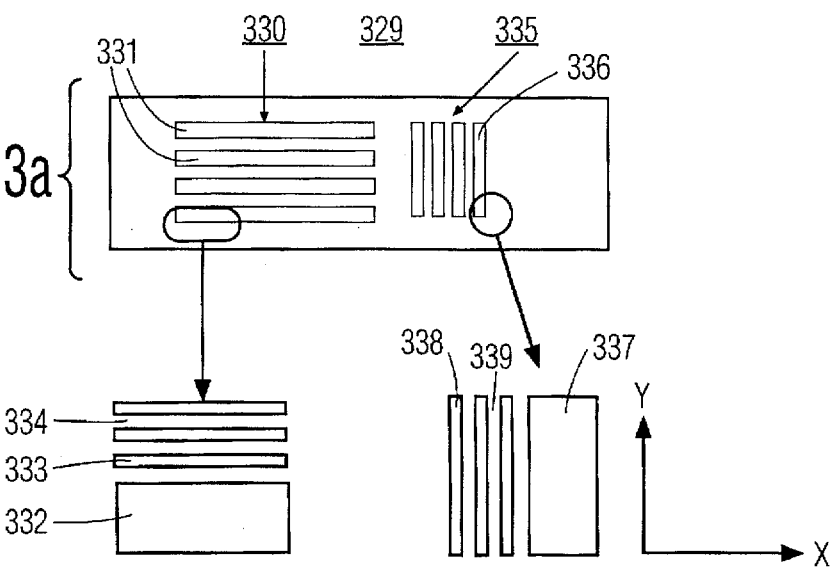
FIG. 23a
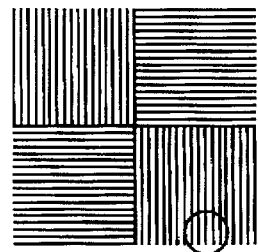
FIG. 23b
FIG. 23c
FIG. 24a
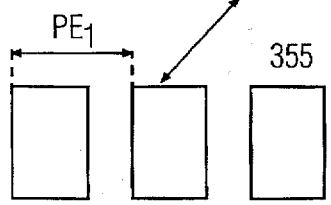
FIG. 24b
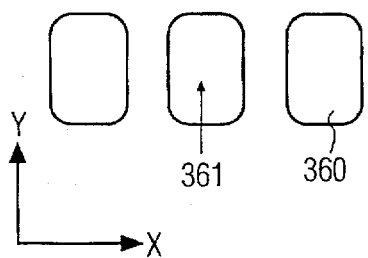
FIG. 24c

METHOD OF REPETITIVELY IMAGING A MASK PATTERN ON A SUBSTRATE, AND APPARATUS FOR PERFORMING THE METHOD

BACKGROUND OF THE INVENTION

1. Field of the Invention

The invention relates to a method of repetitively imaging a mask pattern, provided in a mask table, on a substrate provided in a substrate table, by means of a projection beam, and to an apparatus for repetitively imaging a mask pattern provided in a mask.

2. Description of the Related Art

Such a method and optical apparatus for repetitively imaging an IC mask pattern on IC production substrates are known from the article "In-process Image Detecting Technique for Determination of Overlay, and Image Quality for ASM-L Waferstepper" in: Spie vol. 1674 Optical/Laser Microlithography V (1992). As described in this article, a test mask may be arranged in the apparatus and imaged on a test substrate or a production substrate before a start is made with the production projection process, i.e. the formation of production mask pattern images on production substrates. The projection beam radiation which is incident via the mask on the photoresist provided on the substrate causes an optically detectable change in this layer, predominantly a change of the refractive index, in accordance with a pattern which corresponds to the pattern of the mask. This pattern in the photoresist which is not yet developed is referred to as latent image. This latent image may be used for various purposes, notably for global alignment of the mask with respect to the substrate and for checking critical line widths in the mask pattern image, the magnification, the radiation energy quantity, focusing of the projection beam on the photoresist and variations in the image due to, inter alia a temperature variation. Instead of on a test substrate, latent images may alternatively be formed on a production substrate in which the number of IC patterns which can be formed on the substrate is reduced by the number of latent images formed on this substrate for control purposes.

The advantage of latent-image detection is that said alignment and checks can be performed in the apparatus itself and that it is no longer necessary, as was previously done, to remove the substrate with the test mask image from the apparatus, to develop it and inspect it by means of, for example a scanning electron microscope, which is timeconsuming, in which time the apparatus cannot be used.

Said article in Spie vol. 1674 concentrates on the determination of the optimum focusing by making use of the alignment device of the projection apparatus for detecting the latent image. This alignment device is present in the apparatus for detecting the extent to which a mask has been aligned with respect to a substrate. This device makes use of alignment marks in the substrate and of at least one alignment mark in the mask which are imaged on each other and yields an alignment signal with which the position of the substrate can be corrected with respect to the mask in such a way that the mask and the substrate are always aligned correctly with respect to each other.

Said article in Spie vol. 1674 is based on an alignment device in which the alignment marks have the form of diffraction gratings and in which only the radiation of an alignment beam diffracted in the first diffraction orders is detected. The alignment gratings have grating periods which are larger than the resolving power of the projection lens system. An accurate alignment signal can be obtained with these gratings. The optical system for imaging these alignment gratings on each other has a relatively large depth of focus and is thus relatively insensitive to focus errors so that the alignment device is primarily unsuitable for detecting focus errors.

In accordance with the article in Spie vol. 1674, it is possible to detect a focus error with the alignment device if a latent image of a test mark is formed in the photoresist, which test mark has a basic structure which is equal to that of the alignment mark, but in which the strips are divided into a number of sub-strips alternately being transmissive and non-transmissive to the projection beam radiation. The strip structure has a period which is of the order of the resolving power of the projection lens system so that the structure of the latent image of the test mark and hence the amplitude of the signal of the alignment device is dependent on the extent to which the projection beam is focused on the photoresist. This signal may be used for detecting focus errors. The advantage of using this test mark is that it is not necessary to build a separate latent-image detection device into the projection apparatus. The focus error signal thus obtained has, however, a relatively small amplitude, whereas the signal curve has a relatively plane variation so that it is difficult to determine the focus error with a sufficient accuracy. Moreover, in these and other known methods of latent-image detection, with which changes of the amplitude of the detection signal are determined, the measuring result is dependent on variations of the reflection coefficient of the substrate plus the photoresist and on variations of the thickness of the photoresist, which variations result in variations of the radiation energy absorbed by the photoresist, hence in variations of the refractive index profile in the photoresist.

SUMMARY OF THE INVENTION

The present invention has for its object to provide a test mark-image detection method for, inter alia a focus measurement in a lithographic projection apparatus which does not have the above-mentioned drawbacks and supplies a reliable and accurate signal, while maintaining the advantages of the method in accordance with the Spie vol. 1674 article.

Generally speaking, in accordance with the invention, the method may comprise the following steps: providing a mask having at least one test mark in the mask table, which test mark has a periodical structure of strips alternating with intermediate strips which are non-transmissive to the projection beam radiation; providing a substrate having a radiation-sensitive layer in the substrate table; projecting the image of at least one test mark of the mask in the radiation-sensitive layer by means of the projection beam and a projection system; detecting said image by means of an alignment device for aligning an alignment mark of a mask with respect to an alignment mark of a substrate; setting at least one parameter influencing the quality and position of the mask pattern image by means of the output signal of the test mark-image detection device, and repetitively imaging a production mask pattern at consecutive, different positions on a production substrate.

The invention also relates to a test mask which is particularly suitable for use in the method and to an apparatus for repetitively imaging a mask pattern, provided in a mask, on a substrate with which the method can be performed.

The projection beam may be formed by a beam of optical radiation, for example deep UV radiation which is used in an optical lithographic apparatus for repetitively imaging an IC mask pattern on a substrate in accordance with the step principle or in accordance with the step-and-scan principle. In the step method, an IC mask pattern is imaged on the substrate, in a first IC area, subsequently the substrate is moved with respect to the mask pattern until a second IC area of the substrate is under the mask pattern and this pattern is imaged a second time, subsequently the substrate is moved again, and so forth, until an image of the mask pattern has been formed on all IC areas of the substrate. In the step-and-scan method, the IC mask pattern is not imaged in one flash, but a narrow projection beam is used which projects each time a part of the pattern corresponding to the beam cross-section, and both the mask pattern and the substrate are moved with respect to this beam until this beam has scanned the complete IC pattern and a full image of the IC pattern has been formed in a first IC area of the substrate. Subsequently, the substrate is moved until a second IC area is located under the mask pattern and the process of imaging by scanning is repeated, and so forth.

The projection beam may not only be an optical beam but also a charged-particle beam such as an electron beam or an ion beam with which an image of a mask pattern can be formed in a layer by means of a suitable projection system and in which such a beam causes changes of the refractive index in this layer, or chemical changes which can be converted into optically detectable changes.

It will be evident from the foregoing that the projection system may be an optical lens system but also a system, such as an electron lens system, which is used for imaging by means of a charged-particle beam.

The novel method is not only suitable for detecting latent images, but may also be used to great advantage for examining developed images which, due to their development, have been converted into phase structures. Detection of developed images is particularly important when using photoresists which are especially suitable for radiation at a wavelength in the far ultraviolet range and with which IC mask images having very small line widths, of the order of 0.25 μm, can be realized.

To this end, the method according to the invention is characterized in that use is made of a test mark whose strips are partly non-transmissive to the projection beam radiation and partly consist of a plurality of sub-strips which are alternately transmissive and non-transmissive to the projection beam radiation, and in that the test mark-image detection consists of, first, aligning the test-mark image with respect to a mask mark and subsequently detecting a change in the asymmetry of the test-mark image caused by a parameter to be measured and interpreted by the alignment device as a shift of said image.

The test-mark image may be both a latent image, i.e. a non-developed image, and an image which is developed and has acquired a phase structure due to this development. However, it may also be an image which is heated after it has been projected, so that a latent image is produced via chemical reactions, i.e. an image causing optical path-length differences in a detection beam. The latter image is referred to as PEB (Post-Exposure Baking) image.

In this method, use is made of the fact that, when two symmetrical alignment marks are aligned with respect to each other, the alignment device ascertains that the centre of one of these marks coincides with the centre of the image of the second mark, whereas when an asymmetrical test mark is aligned with respect to an alignment mark, said device indicates that the centre of this test mark is shifted with respect to the centre, or point of gravity, of the alignment mark.

Moreover, the method according to the invention is based on the recognition that by making use of the non-linear effect of the photoresist, i.e. the quantity of activated material of this resist does not increase linearly with the quantity of captured radiation and that by overexposing the photoresist, said shift of the point of gravity will be dependent on, inter alia the focusing of the projection system. When the projection system is defocused with respect to the plane of the photoresist, the contrast of the air image formed in this plane in the absence of this resist would be reduced. For the latent image formed in the photoresist, such a defocusing has the result that the refractive index of parts of the second sub-strips will be more equal to that of the first sub-strips and said central part of the intermediate strips. Due to the overexposure of the photoresist applied in focus detection, the refractive index difference even disappears for these parts. With an increasing defocusing, said parts will be larger and the latent image will be less asymmetrical and rather acquire the shape of a symmetrical alignment mark.

Generally, the variation $\Delta n$ is proportional to $n_o (1-e^{E/E_o})$ in which $n_o$ is the initial refractive index, E is the actual illumination dose and Eo is a given threshold value for the illumination dose. For overexposure it holds that E>Eo; then the refractive index no longer changes linearly with E.

Also the developed image of an asymmetrical test mark will become increasingly symmetrical when the image is more and more defocused. This is also true of an asymmetrical PEB image.

When the alignment device observes the test-mark image, a change of the asymmetry therein, for example due to a focus error is interpreted as a shift of the image with respect to a reference. This reference is obtained by accurately aligning, before the test-mark image is detected, for example the substrate and the mask with respect to each other by means of the (global) alignment marks which are already present in the mask and the substrate, and by subsequently shifting the test-mark image towards the alignment beam by means of the same alignment device under accurate displacement measurement and control by means of a multi-axis interferometer system which is already present in the projection apparatus for determining the mutual motions of the substrate table and the mask table. By comparing the detected position of the test-mark image with said reference, the apparent displacement of the test-mark image due to a focus error acquires the effect of a zero offset of the alignment signal. This zero offset is maximal at the correct focusing and minimal at a sufficiently large defocusing. Thus, during projection, a defocusing is convened into an apparent shift of the latent image and no longer into a change of the intensity of the alignment beam, as in the device described in said Spie vol. 1674 article. Since the focus detection now employs high illumination quantities and the photoresist is saturated during projection, the measured shift, and hence the focus detection, is insensitive to variations of the reflection coefficient of substrate and photoresist and variations of the thickness of the photoresist.

A first embodiment of the method according to the invention is further characterized in that the latent image formed in the photoresist is detected by means of the alignment device after the test mark has been imaged in said photoresist.

This provides the possibility of a rapid measurement of, for example, focus errors.

A second embodiment of the method according to the invention is characterized in that the substrate is removed from the substrate table, subsequently developed and then placed on the substrate table again after the test mark has been imaged in the photoresist, whereafter the developed test-mark image is detected by means of the alignment device.

Detector signals having large amplitudes can be obtained in this way.

Both embodiments have the advantage that the test-mark images are measured in the same apparatus as the one with which the images have been formed, and that the measurement can be carried out more rapidly as compared with the use of an optical or electron microscope.

An embodiment of the method in which a better reference for the testmark image signal is obtained is characterized in that use is made of a double mark which consists of said test mark and an associated alignment mark whose periodical structure of undivided strips and intermediate strips is equal to that of the test mark, and in that said alignment mark is used for aligning the test mark.

Since the alignment mark used as a reference is located proximate to the test mark, the reference will be considerably more reliable than if it is derived from an alignment mark which is present at a larger distance from the test mark.

In the alignment device use is preferably made of alignment marks comprising a plurality of linear gratings and a detector which is sub-divided into a corresponding plurality of parts. If the grating strips of one of the gratings are perpendicular to those of another grating, the alignment can be determined in two mutually perpendicular directions. To be able to use this preferred embodiment of the alignment device, a further characteristic feature of the method according to the invention employs a test mark having a plurality of parts, while the direction of the strips and intermediate strips of a part is perpendicular to the direction of the strips and intermediate strips of another part.

If the test-mark image is only to be used for performing a limited number of measurements, for example of the optimum focusing and/or the illumination dose, the method according to the invention may be further characterized in that use is made of a production mask which is provided with at least one test mark.

A limited number of test marks may be provided on a production mask, for example close to the alignment marks which are present anyway, so that it is not necessary to use a separate test mask.

For obtaining a large degree of freedom in the choice of the positions of the test-mark images on the substrate, and hence in measuring possibilities, the method according to the invention is further characterized in that use is made of a test mask which is provided with at least one test mark.

After performing measurements on and/or by means of test-mark images, this test mask is replaced by a production mask.

A further embodiment of the method according to the invention is further characterized in that a plurality of images of at least one test mark is formed in the photoresist, each time at a different focusing of the projection system, in that the photoresist is overexposed during multiple imaging of the test mark and in that the optimum focusing of the projection system is determined from the signals which are obtained when detecting each of said images by means of the alignment device.

With the information thus obtained the optimum focus for the prevailing circumstances can be adjusted before projecting a production mask pattern on a production substrate, taking into account, inter alia the developing process still to be performed.

This embodiment may be further characterized in that the optimum focusing signal obtained via the test-mark image detection is compared with a focus-measuring signal obtained by means of a separate focus-measuring device and used for calibrating said device.

The separate focus-measuring device may be formed as described in U.S. Pat. No. 4,356,392. In this device a focus-measuring beam by-passing the projection lens system is directed obliquely onto the substrate and the beam reflected by the substrate is received by a position-sensitive focus detector. The distance between the substrate and the projection lens system with which the focus-measuring device is connected can be determined from the position of the spot of the chief ray of the reflected focus-measuring beam on the detector. This focus-measuring device is used for measuring said distance during the production projection process and for correcting possible focus errors with reference to the measuring result. Other known devices such as, for example those described in U.S. Pat. No. 5,191,200 may alternatively be used for the focus-measuring device.

Another embodiment of the method according to the invention is further characterized in that one image of at least one test mark is formed in the photoresist, using a given illumination dose, in that the alignment signal offset associated with this illumination dose and determined by the asymmetry in the aligned test-mark image is determined, and in that it is checked in further measurements whether this offset is maintained.

Prior to this measurement, the best illumination dose may be ascertained for this combination of a projection apparatus and a given photoresist. This may be effected, for example in a conventional manner by making a plurality of mask pattern images in the photoresist, each time using a different illumination dose, subsequently removing the substrate with the photoresist from the projection apparatus and developing it, and finally observing the separate images in a scanning electron microscope so as to ascertain which illumination dose yields the best results. The optimum illumination dose thus determined is the "given" illumination dose used in the last-mentioned method.

The illumination dose is understood to mean the total radiation energy taken up by the substrate when one image is formed. This energy may be applied in a pulsed manner.

It has been found that, even if no overexposure is used for imaging a test mark in the photoresist, there is still a sufficiently large non-linear effect in this layer, while upon variation of the illumination dose such apparent displacements, for example, several nm per m Joule/cm$^2$ of the test-mark image occur that these can be measured with a sufficiently large accuracy by means of the alignment device. Thus, the illumination dose can be adjusted accurately at several m Joules.

If the signal obtained via test-mark image detection and associated with the optimum illumination dose tends to become unreliable because this signal may become too small, the measurement may be extended by determining alignment signal offsets for different quantities of illumination so that a table of illumination quantities and associated alignment signal offsets can be made and stored, which table may be used at a later stage to fix and possibly correct the real illumination dose used.

In said illumination dose offset measurements, illumination quantities ranging between 100 and 300 mJ/cm$^2$ are used.

A preferred embodiment of the method according to the invention is characterized in that use is made of a test mask in which a plurality of test marks is provided, in that said test mask is imaged a number of times in different areas of the photoresist, each time at a different focusing of the projection system, in that the optimum focusing is determined for each test mark from the signals obtained when detecting each image associated with said test mark by means of the alignment device, and in that optical properties of the projection lens system are determined by comparing the optimum focusing values for the different test marks.

In this way, various parameters of the projection system, such as field curvature and astigmatism, distortion and tilt can be determined. The projection system can be corrected by means of the results of these measurements.

A further embodiment of the method according to the invention is characterized in that a plurality of images having equal focusing values of at least one test mark is formed in different areas of the photoresist, and in that the signals obtained when detecting the formed images by means of the alignment device are compared with each other.

The substrate may be illuminated, for example via the test mask in an analogous manner as is common practice for illuminating a production substrate via a production mask, i.e. a test-mark image is formed in all areas of the substrate where an IC must be formed. Subsequently, by detecting the latent images in the different areas, the behaviour of the projection apparatus throughout the substrate surface, such as the behaviour of the substrate table, can be determined relatively rapidly. In this way the tilt of or unevennesses in the substrate plus the photoresist can be determined. The information thus obtained may be used at a later stage when illuminating the separate IC areas of a production substrate via a production mask.

In this embodiment of the method it is sufficient to image one test mark in the different IC areas of the photoresist, while ensuring that the focusing for each image is the same. A more accurate measurement is possible if this embodiment is further characterized in that a plurality of images of the test mark each time having a different focusing is formed in each area of the photoresist, in that the optimum focusing is determined for each of these areas and in that said optimum focusing values are compared with each other.

The invention also relates to a novel test mask intended for use in the method described hereinbefore. This test mask, which is provided with at least one test mark and at least one alignment mark, in which the alignment mark has a periodical structure of strips which are transparent to the projection beam radiation and alternate with opaque intermediate strips is characterized in that the test mark has a similar structure with the same period as that of the alignment mark, and in that the strips of the test mark are partly transparent to the projection beam radiation and partly consist of sub-strips which are alternately transparent and opaque to this radiation.

Said alignment mark may be formed by the global alignment mark which is also present in a production mask outside the IC pattern to be projected for aligning the mask with respect to the substrate. By making use of this alignment mark and the very accurate interferometer device for displacing the substrate table, the test mark in the aligned state can be introduced into the measuring beam of the alignment device.

A more accurate alignment and a more rapid detection of the test mark may, however, be realised if the test mask is further characterized in that an alignment mark of said type is provided proximate to each test mark.

A preferred embodiment of the test mask is further characterized in that it comprises a test mark in at least the four corners in addition to a test mark in the centre.

With such a test mask the optical qualities of the projection lens system can be determined throughout the field, for example a possible tilt of the image field.

In accordance with a further preferred embodiment, the test mask is further characterized in that each test mark is a grating having a periodical structure in two mutually perpendicular directions.

With such a test mask the behaviour of the projection lens system in the projection apparatus can be quickly determined in two mutually perpendicular directions, for example, the astigmatism of this system can be measured.

The test-mark grating having a two-dimensional periodical structure may be formed by a checkerboard grating which consists of superjacent and juxtaposed blocks alternately being transmissive to radiation and non-transmissive to radiation. Such a checkerboard grating may be made asymmetrical by subdividing each transmissive block into a non-transmissive part and a part consisting of sub-strips which are alternately transmissive and non-transmissive to radiation.

A preferred embodiment of the two-dimensional test mark is, however, characterized in that it is constituted by a grating comprising a plurality of grating portions, in which the direction of the grating strips of one portion is perpendicular to the direction of the grating strips of a second portion.

The test mask according to the invention may be further characterized in that the strips of each test mark comprise three transparent and three opaque sub-strips.

It has been found that optimum measuring results can be obtained with such a test mask for a conventional embodiment of the projection lens system.

The test mask may be further characterized in that the sub-strips of a test mark have the same direction as the opaque intermediate strips of said test mark.

The above-mentioned parameters of the projection lens system, such as field curvature, astigmatism, distortion and tilt can be determined by means of this test mark.

Alternatively, the test mask may be further characterized in that the direction of the sub-strips of a test mark extends at an acute angle to the direction of the opaque intermediate strips of said test mark.

Said angle is, for example 45°. In addition to said parameters, the astigmatism may also be determined at an angle of 45°, i.e. the difference between the foci formed in two mutually perpendicular directions which extend at an angle of 45° to the X and Y directions of the apparatus.

The test mark according to the invention may be further characterized in that the strips are wider than the intermediate strips.

Due to the second, coarser, asymmetry which is built in the test mark, the effect of the first asymmetry, which is given by the sub-division into sub-strips, is enhanced.

The test mark may consist of four equally large parts arranged in a square. Another embodiment of this test mark is further characterized in that it is elongated and consists of two parts, in which the grating strips of one part are perpendicular to those of the other part, and in that it has such a width that it fits in an intermediate area on the substrate, which is situated between two areas in which a production mask pattern is to be imaged.

Said intermediate area is referred to as scribe line. The number of IC areas on the substrate may be maintained when this test mark is used, so that the test mark is eminently suitable for use in combination with a production substrate.

In accordance with a further aspect of the invention, the test mask may be further characterized in that the test mark has a similar structure and the same period as that of the alignment mark, and in that the test-mark strips consist of a first, transparent, pan and a second, opaque, pan in which transparent sub-micron areas are provided, said second pan operating as a grey filter.

The sub-micron areas have, for example dimensions of the order of 0.2 μm and cannot be imaged separately by the projection lens system, so that these areas are projected as grey spots in the photoresist. It has been found that this test mark is eminently suitable for measuring illumination quantities. As will be explained hereinafter, the image of this test mark is maximally asymmetrical at a low illumination dose, and this image will be more and more symmetrical at an increasing illumination dose. The illumination dose can then be measured by means of the alignment device because the change of symmetry becomes manifest in an apparent offset of the test-mark image with respect to the alignment mark.

The illumination dose measurement by means of the special test mark may be carried out on the latent image, the PEB image, or the developed image of this test mark. Moreover, the width of the strips in this special test mark may also be chosen to be larger than that of the intermediate strips, so that an enhanced asymmetrical effect is obtained again.

The invention also relates to an apparatus for repetitively imaging a mask pattern on a substrate provided with a photoresist, which apparatus comprises successively an illumination system for supplying a projection beam, a mask table, a projection lens system and a substrate table and is further provided with an alignment device for aligning a mask with respect to a substrate, and a test-mark image detection device which is constituted by the alignment device. According to the invention, this apparatus is characterized in that the test-mark image detection device is adapted to detect, during each test-mark image detection cycle, the image of both a test mark and an associated alignment mark spaced apart therefrom at a defined distance, and is provided with means for determining the difference between the observed aligned positions of the two marks.

Said means may be constituted by electronic signal-processing and control means which first determine that the image of an alignment mark associated with the test mark has been aligned with respect to this alignment mark in the mask, subsequently supply a control signal to the substrate table positioning means with which the substrate is displaced over a distance which is equal to the distance between the centres of the images of the test mark and the associated alignment mark and finally determine the difference between the detection signals obtained in detecting said two images. This difference is the above-mentioned offset of the alignment signal.

The projection apparatus in which the method according to the invention is used is based on the recognition that not all separate parameters determining the imaging quality should be known exactly, but that the image quality and the image position as a whole must be known and that, with a measured deviation of this quality and position, the measuring signals can be processed simultaneously in a computer and via a model comprising all parameters and their mutual relations so as to form control signals for correcting one or more of the apparatus parameter(s) in such a way that the image acquires the desired quality and position.

Via the test-mark image detection device, the conventional focus detection device, the alignment device and the substrate table position detection device are coupled together, so that an integrated measuring system is obtained with which all relevant parameters can be measured.

BRIEF DESCRIPTION OF THE DRAWINGS

For a fuller understanding of the invention, reference is had to the following description taken in connection with the accompanying drawings, in which In the drawings:

FIG. 1A shows diagrammatically an embodiment of an apparatus for repetitively imaging a mask pattern on a substrate, FIG. 1B shows an enlargement of the substrate depicted in FIG. 1A FIG. 2 shows an embodiment of a known two-dimensional alignment mark for use in such an apparatus, FIG. 6A, 6B, 6C show an embodiment of an asymmetrical test mark according to the invention, FIGS. 7a and 7b show the variation of the latent-image detection signal as a function of the defocusing for two directions, FIG. 17 shows the distortion of such a system, FIGS. 18A–18C show a test mark and an associated reference mark with an opposed symmetry, FIGS. 20A, 20B show an embodiment of the testmark with which astigmatism at an angle to the X and Y directions can be measured, FIGS. 21A, 21B, 21C show the combination of this test mark and a reference mark having a mirrored strip structure, FIG. 22 shows a test mark whose strips are wider than the intermediate strips, FIGS. 23A, 23B, 23C show a test mark which is suitable to be projected in the scribe line of an IC, FIGS. 24A–24C show an alignment mark which is specially suitable for measuring illumination quantities.

DESCRIPTION OF THE PREFERRED EMBODIMENTS

Figure 3:
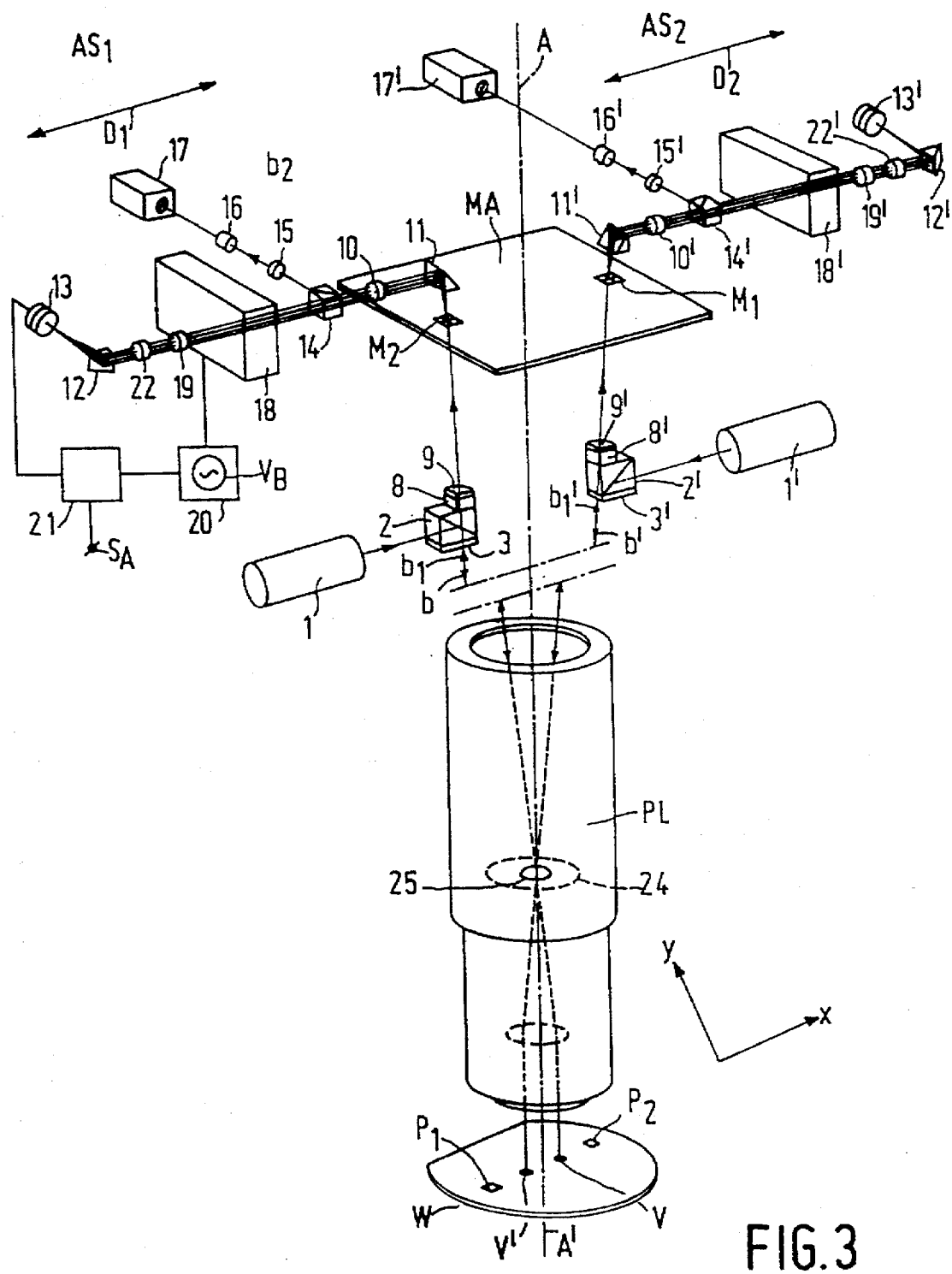
FIG. 3 shows a known embodiment of an alignment device for such an apparatus.

FIGS. 1A and 1B show diagrammatically a known embodiment of an apparatus for repetitively imaging a mask pattern on a substrate in accordance with the step principle. The main components of this apparatus are a projection column in which a mask pattern C to be imaged is provided and a movable substrate table WT with which the substrate can be positioned with respect to the mask pattern C.

The projection column accommodates an illumination system which comprises, for example a laser LA, a beam widener $E_x$, an element IN also referred to as integrator realising a homogeneous distribution of radiation within the projection beam PB, and a condensor lens CO. The projection beam PB illuminates the mask pattern C present in the mask MA, which mask is arranged on a mask table MT.

The beam PB passing through the mask pattern C traverses a projection lens system PL which is arranged in the projection column and is only shown diagrammatically, which projection lens system forms images of the pattern C on the substrate W. The projection lens system has, for example a magnification M=⅕, or M=¼, a numerical aperture NA=0.6 and a diffraction-limited image field having a diameter of 22 mm.

The substrate W is arranged on a substrate table WT supported, for example by air bearings. The projection lens system PL and the substrate table WT are arranged in a housing HO whose lower side is closed by a base plate BP of, for example granite and whose upper side is closed by the mask table MT.

As is shown in FIG. 1A, the mask MA comprises, for example two alignment marks $M_1$ and $M_2$. These marks preferably consist of diffraction gratings but may alternatively be constituted by other marks having a symmetrical structure. The alignment marks are preferably two-dimensional, i.e. their grating strips extend in two mutually perpendicular directions, the X and Y directions in FIG. 1B. The substrate W, for example a semiconductor substrate on which the pattern C must be imaged a number of times next to each other comprises a plurality of alignment marks, preferably again two-dimensional diffraction gratings, two of which, $P_1$ and $P_2$, are shown in FIG. 1B. The marks $P_1$ and $P_2$ are located outside the areas of the production substrate W on which the images of the pattern C must be formed. The grating marks $P_1$ and $P_2$ are preferably constituted as phase gratings and the grating marks $M_1$ and $M_2$ are preferably constituted as amplitude gratings.

FIG. 2 shows an embodiment of one of the two identical substrate phase gratings on a larger scale. Such a grating may comprise four sub-gratings $P_{1,a}$, $P_{1,b}$, $P_{1,c}$ and $P_{1,d}$, two of which, $P_{1,b}$ and $P_{1,d}$, are used for alignment in the X direction and the two others, $P_{1,a}$ and $P_{1,c}$, are used for alignment in the Y direction. The two sub-gratings $P_{1,b}$ and $P_{1,c}$ have a grating period of, for example 16 μm and the sub-gratings $P_{1,a}$ and $P_{1,d}$ have a grating period of, for example 17.6 μm. Each sub-grating may have a dimension of, for example 200×200 μm. With this grating and a suitable optical system an alignment accuracy which, in principle, is smaller than 0.1 μm can be achieved. Different grating periods have been chosen so as to increase the capturing range of the alignment device.

FIG. 3 shows the optical elements of the apparatus used for aligning a production mask with respect to a production substrate. The apparatus comprises a double alignment detection system consisting of two separate and identical alignment systems $AS_1$ and $AS_2$ which are positioned symmetrically with respect to the optical axis AA' of the projection lens system PL. The alignment system $AS_1$ is associated with the mask alignment mark $M_2$ and the alignment system $AS_2$ is associated with the mask alignment mark $M_1$. The corresponding elements of the two alignment systems are denoted by the same reference numerals, while those of the system $AS_2$ are distinguished from those of the system $AS_1$ by means of the primed notation.

The structure of this system $AS_1$ will now be described, as well as the way in which the mutual position of the mask mark $M_2$ and, for example the substrate mark $P_1$ is determined by means of this system.

The alignment system $AS_1$ comprises a radiation source 1, for example a helium-neon laser which emits an alignment beam b. This beam is reflected towards the substrate W by a beam splitter 2. The beam splitter may consist of a semitransmissive mirror or a semitransmissive prism but is preferably constituted by a polarization-sensitive dividing prism which is followed by a λ/4 plate 3 in which λ is the wavelength of the beam b. The projection lens system PL focuses the beam b in a small radiation spot V having a diameter of the order of 1 mm on the substrate W. This substrate reflects a part of the beam as beam $B_1$ towards the mask MA. The beam $b_1$ traverses the projection lens system PL, which system images the radiation spot V on the mask. Before the substrate is arranged in the illumination apparatus, it has been prealigned in a prealignment station coupled to the apparatus, for example the station described in European Patent Application 0.164.165, such that the radiation spot V is located on the substrate mark $P_2$. This mark is then imaged by the beam $b_1$ on the mask mark $M_2$. Taking the magnification M of the projection lens system into account, the dimension of the mask mark $M_2$ is adapted to that of the substrate mark $P_2$ so that the image of the mark $P_2$ accurately coincides with the mark $M_2$ when the two marks are mutually positioned correctly.

On its path to and from the substrate W, the beam b and $b_1$ has traversed the λ/4 plate 3 twice, whose optical axis is at an angle of 45° to the direction of polarization of the linearly polarized beam b emitted by the source 1. The beam $b_1$ passing through the λ/4 plate then has a direction of polarization which is rotated 90° with respect to the beam b so that the beam $b_1$ is passed by the polarization dividing prism 2. The use of the polarization dividing prism in combination with the λ/4 plate provides the advantage of a minimal radiation loss when coupling the alignment beam into the radiation path of the alignment system.

The beam $b_1$ passed by the alignment mark $M_2$ is reflected by a prism 11 and directed towards a radiation-sensitive detector 13, for example by a further reflecting prism 12. This detector is, for example a composite photodiode having, for example four separate radiation-sensitive areas in conformity with the number of sub-gratings in accordance with FIG. 2. The output signals of these detectors are a measure of the coincidence of the mark $M_2$ with the image of the substrate mark $P_2$. These signals may be processed electronically and used for moving the mask with respect to the substrate by means of driving systems (not shown), such that the image of the mark $P_2$ coincides with the mark $M_2$. An automatic alignment apparatus is thus obtained.

A beam splitter 14 in the form of, for example a partially transmissive prism may be arranged between the prism 11 and the detector 13, which prism splits a portion of the beam $b_1$ as beam $b_2$. The split beam $b_2$ is then incident via, for example two lenses 15 and 16 on a television camera 17 which is coupled to a monitor (not shown) on which the alignment marks $P_2$ and $M_2$ are visible to a user of the projection apparatus. This user may then ascertain whether the two marks coincide and may displace the substrate W by means of manipulators so as to cause the marks to coincide. Analogously as described above for the marks $M_2$ and $P_2$, the marks $M_1$ and $P_2$, and the marks $M_1$ and $P_1$ may also be aligned with respect to each other. The alignment system $AS_2$ is used for the two last-mentioned alignments.

For particulars about the alignment procedure by means of the alignment systems, reference is made to U.S. Pat. No. 4,778,275. As also described in this Patent, the alignment systems $AS_1$ and $AS_2$ cooperate very closely with an extremely accurate two-dimensional displacement measuring system for measuring the displacement of the substrate with respect to the mask during the alignment procedure. Then the positions of and the mutual distances between the alignment marks $P_1$ and $P_2$, $M_1$ and $M_2$ can be fixed in a system of coordinates determined by the displacement measuring system. The displacement measuring system denoted by IF in FIG. 1A is, for example an interferometer system described in U.S. Pat. No. 4,251,160.

Since the projection lens system PL is designed for the wavelength of the projection beam PB, which should be as small as possible in connection with the desired large resolving power, and may thus differ considerably from that of the alignment beam, deviations may occur when using this system PL for imaging the alignment marks $P_1$, $P_2$ and $M_1$, $M_2$ on to each other. Then, the substrate alignment marks $P_1$, $P_2$ may not be imaged in the plane of the mask pattern in which the mask alignment marks are located but at a given distance therefrom, which distance depends on the difference between the wavelengths of the projection beam and the alignment beam and the difference between the refractive indices of the material of the projection lens elements for the two wavelengths. If the projection beam has a wavelength of, for example 248 nm and the alignment beam has a wavelength of 633 nm, this distance may be as much as 2 m. Moreover, due to said wavelength difference, a substrate alignment mark is imaged on a mask alignment mark having a magnification which deviates from the desired magnification, which deviation increases with an increasing wavelength difference.

To correct for said deviations, an extra lens, or correction lens 25 may be arranged in the projection column PL. In contrast to what is shown in FIG. 3, the alignment beam is then not coupled into the apparatus above the projection lens but through a window in the lens holder and with a reflecting element such as a wedge under and proximate to the correction lens. The correction lens is arranged at such a height in the projection column that the sub-beams of the different diffraction orders of the alignment beam in the plane of the correction lens, which sub-beams are formed by a substrate alignment mark, are sufficiently separated so as to be able to influence these sub-beams separately, and on the other hand this correction lens has a negligible influence on the projection beam and the mask image formed therewith. The projection lens is preferably located in the rear focal plane of the projection lens system. If this system is telecentric at the substrate side, this focal plane coincides with the plane of the exit pupil of this system. If, as is shown in FIG. 3, the correction lens 25 is in a plane 24 where the chief rays of the alignment beams b and b' intersect each other, this lens can be simultaneously used for correcting the two alignment beams.

The correction lens has such a power that it changes the direction of the sub-beams diffracted in the first order by a grating in such a way that the chief rays of these beams intersect each other in the plane of the mask alignment mark $M_2$. Moreover, the correction lens has such a small diameter that the higher-order sub-beams which are deflected through larger angles by the mark $P_2$ than the first-order sub-beams do not pass through this lens. The correction lens further comprises an element preventing the zero-order sub-beams b(0), b'(0) from passing through the correction lens. This element may be constituted by said wedge which is used for coupling the alignment beam into the projection lens system. It is achieved by said measures that only the first-order sub-beams are used for imaging the grating $P_2$ on the grating $M_2$, so that some additional advantages are obtained.

By suppressing the zero-order sub-beam, the contrast in the image of $P_2$ can be increased considerably. This renders the alignment device particularly suitable for the latent-image detection to be described hereinafter, because latent images of themselves have a relatively low contrast. Since the second and higher-order sub-beams are suppressed, irregularities in the grating $P_2$ do not have any influence on the alignment signal. When only the first-order sub-beams are used, the second harmonic of the grating $P_2$ is imaged, as it were. In other words, apart from the magnification M of the projection lens system PL, the image of $P_2$ has a period which is half that of the grating $P_2$. If it is ensured that the grating period of the grating $M_2$ is equal to that of the image of $P_2$, i.e. equal to m/2 times the grating period of the grating $P_2$, the accuracy with which the gratings $M_2$ and $P_2$ are aligned is twice as large as in the situation where the full beam b is used for the image.

After the description of the system $AS_1$, which is used for aligning the mask alignment mark $M_2$ with respect to a substrate alignment mark, the system $AS_2$ with which the mask alignment mark $M_1$ is aligned with respect to a substrate alignment mark does not need any further explanation. The system $AS_2$ comprises similar elements and operates in the same way as the system $AS_1$. As already shown in FIG. 3, the systems $AS_1$ and $AS_2$ have the correction lens 25 in common. Instead of a double alignment device, the projection apparatus may alternatively comprise a single alignment device as described, for example in U.S. Pat. No. 4,251,160.

The projection apparatus is further provided with a focus servo device comprising a focus error detection device for detecting, during repetitive imaging of a production mask on a production substrate, a deviation between the image plane of the projection lens system and the plane of the production substrate. When such a deviation occurs, the focusing can be corrected by means of the signal supplied by the focus error detection device, for example by displacing the projection lens along its optical axis.

Figure 4:
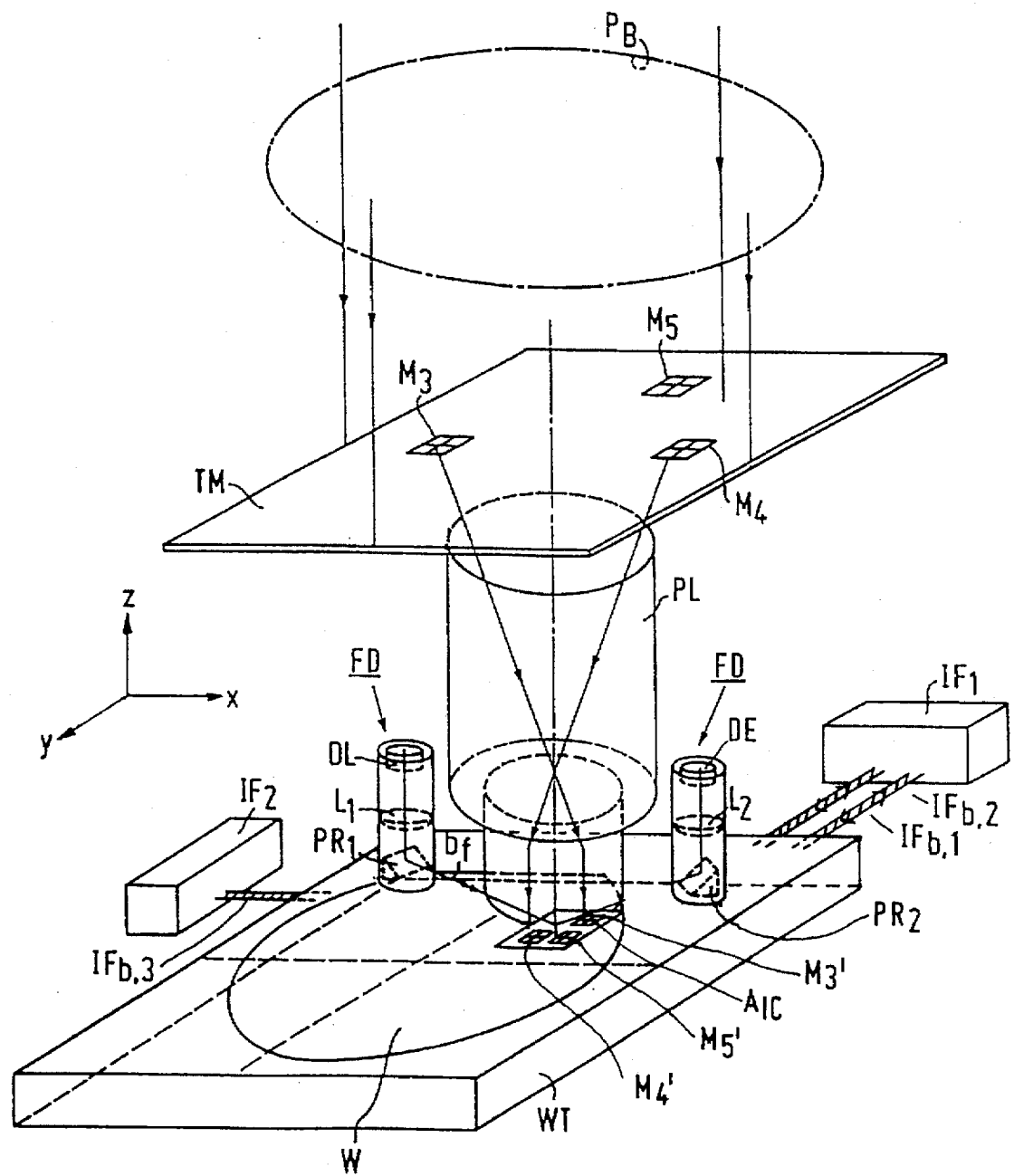
FIG. 4 shows a known embodiment of a focus error detection device and a substrate table position detection device for this apparatus.

This focus error detection device FD is shown diagrammatically in FIG. 4. This Figure also shows the position detection device consisting of two parts $IF_1$ and $IF_2$ for the substrate table.

The focus error detection device FD comprises a radiation source, for example a diode laser DL which supplies a focusing beam $b_f$ and a prism $PR_1$ which reflects this beam towards a point on the substrate W coated with a photoresist, at which point the optical axis of the projection lens system intersects this plate. For the sake of simplicity, only the chief ray of this beam is shown. For the sake of brevity, the combination of substrate and photoresist will hereinafter be referred to as substrate. A lens $L_1$ arranged between the diode laser DL and the prism $PR_1$ focuses the beam to a radiation spot on the substrate. The beam $b_f$ reflected by the substrate is reflected towards a radiation-sensitive detector DE by a second prism $PR_2$. A lens $L_2$ between the prism $PR_2$ and the detector images the radiation spot formed on the substrate on the detector DE. When the distance in the Z direction between the projection lens system and the substrate is changed, the radiation spot formed on the detector DE moves in the detector plane. Since the detector is a position-sensitive detector or consists of two separate detection elements, the displacement of the radiation spot and the corresponding focus error can be determined. The information thus obtained can be used for correcting, for example the Z position of the substrate table WT by means of a known parallelogram construction shown diagrammatically in FIG. 5. The different elements of the focus error detection device are arranged in two, for example cylindrical, holders which are fixedly connected to the holder of the projection lens system.

As described in U.S. Pat. No. 4,356,392, a reflector may be arranged at the location of the detector DE, which reflector ensures that the focusing beam is reflected a second time by the substrate before it is incident on a detector. This preferred embodiment of the focus error detection device has the advantage that the focus error measurement is not influenced by the tilt of the substrate or by local reflection differences of this substrate. The focus error detection device may also be implemented as described in U.S. Pat. No. 5,191,200 and then works with a beam having a wide wavelength band, which beam images a first grating on a second grating via the substrate.

For very accurately determining the X and Y positions of the substrate table, the projection apparatus is provided with a composite interferometer system consisting of, for example two pans. The pan $IF_1$ emits one or more beams into the Y direction towards a reflecting side face of the substrate table and also receives the reflected beams. The X position of the table can be determined thereby. Analogously, the Y position of the substrate table can be detected by means of the interferometer pan $IF_2$. The interferometer system may be implemented as described in U.S. Pat. No. 4,251,160 and then works with two beams. Instead of this two-axis interferometer system, a three-axis system as described in U.S. Pat. No. 4,737,823 or a multi-axis system as described in European Patent Application 0 498 499 may alternatively be used.

By using the substrate table position detection device, or interferometer system, the positions of, and the mutual distances between the alignment marks $P_1$ and $P_2$ and $M_1$ and $M_2$ can be fixed during alignment in a system of coordinates defined by the interferometer system. Then it is not necessary to refer to the frame of the projection apparatus or to a part of this frame so that variations in this frame due to, for example temperature variation, mechanical creep and the like do not have any influence on the measurements.

Figure 5:
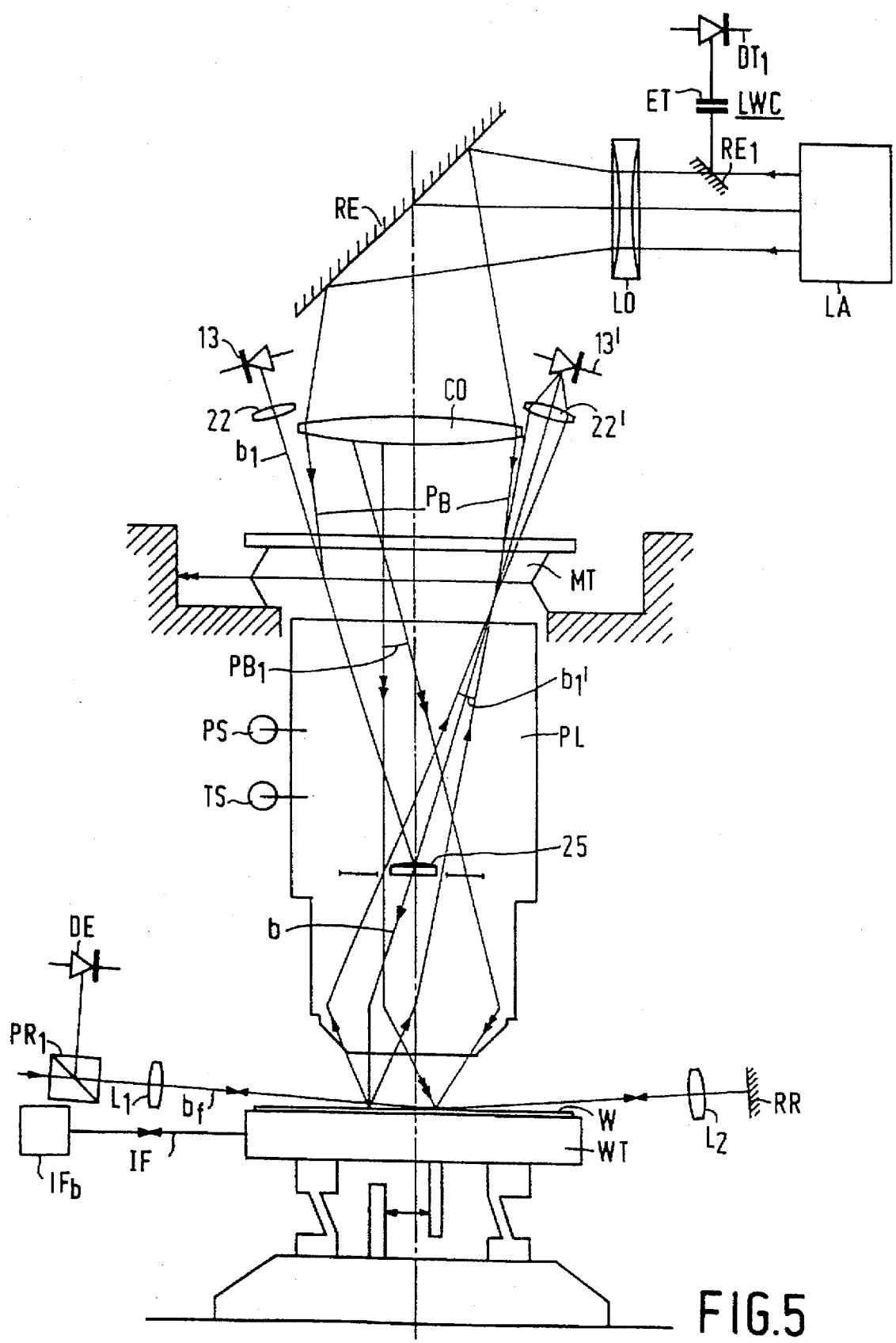
FIG. 5 is a cross-sectional view of the projection apparatus.

For a better insight into the projection apparatus, this apparatus is once more shown in FIG. 5, now in a cross-sectional view. The illumination system has a slightly different structure than in FIG. 1A and comprises a laser LA, for example a Krypton fluoride laser, a lens system LO, a reflector RE and a condensor lens CO. The illumination system is provided with a known system LWC shown diagrammatically, with which the wavelength of the laser radiation can be checked. The system LWC is described in the article "Design Principles for an Illumination System using an Excimer laser as a Light Source" in SPIE vol. 1138 (1989), pp. 121, etc.

For the sake of completeness, FIG. 5 also shows the double alignment detection device which is denoted by an incident beam b and the two exiting alignment beams $b_1$ and $b_1'$ and by the elements 25, 13, 13', 22 and 22'.

FIG. 5 further shows a focus error detection device with lenses $L_1$ and $L_2$ and a retroreflector RE which reflects along itself a focusing beam $b_f$ entering from the left and being reflected a first time by a production substrate or a test substrate. The reflected beam $b_f$ is reflected towards the detector DE by the partially transmissive prism $PR_1$.

The beam $IF_b$ coming from the block IF diagrammatically shows that the apparatus is provided with an interferometric substrate table position detection device.

The references PS and TS denote a pressure sensor and a temperature sensor, respectively.

To be able to measure the settings of the apparatus and the quality of the projection lens system, a mask having at least one test mark is provided in the projection apparatus and this mask is imaged in the photoresist of a substrate, as is shown in FIG. 4. This mask may be a separate test mask TM. However, the test mark may alternatively be provided on a production mask outside the mask pattern C. It has been assumed in FIG. 4 by way of example that this mask comprises three test marks $M_3$, $M_4$ and $M_5$. When the test mask is illuminated by the projection beam, test mark images $M'_3$, $M'_4$ and $M'_5$ are formed in the photoresist of the substrate. These images are located in an area $A_{IC}$ of the substrate covering an area in which one IC is formed during the production projection process. When the test mark patterns are imaged in the photoresist, corresponding patterns of strips alternately having a higher and a lower refractive index are produced therein. Such a pattern behaves as a phase grating, analogously as an alignment grating $P_1$, $P_2$ and can be detected by means of the alignment device if the test mark has the same pattern as a mask alignment mark $M_1$, $M_2$.

According to the invention, a test mark $M_3$ has a pattern as shown in FIG. 6A–6C. This asymmetrical pattern differs from that of the alignment mark (compare FIG. 2) in that the transparent strips, 35, are further subdivided. A pan of the strips, for example half 36, is transparent and the other half consists of opaque sub-strips 37 alternating with transparent sub-strips 38 as is shown at TM in FIG. 6C. For the purpose of comparison, the conforming part of an alignment mark is also shown at AM in this Figure. The period $PE_2$ of the substrips 37 and 38 is considerably smaller than the period $PE_1$ of the alignment mark and preferably approximately equal to one and a half times the resolving power of the projection lens system. Instead of half, another part of the strips 35 may alternatively be subdivided. The choice of the number of sub-strips and their width depends on the projection lens system which must be measured.

All strips 35 of a test mark are of course subdivided in the manner as shown in FIG. 6A–6C. If measurements are necessary in one direction only, this test mark may be a linear grating such as the grating portion $P_{1,a}$. If the test mark comprises two linear gratings such as grating portions $P_{1,a}$ and $P_{1,d}$ for measuring in two mutually perpendicular directions, the strips of the two gratings are subdivided. When a test mark comprising four grating portions $P_{1,a}$, $P_{1,b}$, $P_{1,c}$ and $P_{1,d}$ is used, the strips of all grating portions are subdivided.

Due to their small period, the sub-strips cannot be detected separately by the alignment device. This device is capable, and even has the function of fixing the position of a substrate alignment mark with respect to a mask alignment mark. If the substrate alignment mark and the mask alignment mark have the same periodical structure, taking into account the magnification of the projection lens system and the possible presence of a first-order diaphragm, and if they are correctly aligned with respect to each other, the signal supplied by the alignment detector 13, 13' in FIG. 3 is, for example minimal. If a substrate mark, such as the latent image of the mask test mark of FIG. 6A–6C, has an asymmetrical structure, this mark no longer fits with the mask mark so that the alignment signal is no longer minimal, even if this substrate mark is correctly aligned with respect to the mask mark. The asymmetry in the latent image is interpreted by the alignment device as a shift of this image with respect to its reference, i.e. an alignment mark. Due to the asymmetry the alignment signal, or latent-image detection signal undergoes a zero displacement, which is generally referred to as offset. The non-linear character of the photoresist is then used. By overexposing the resist when the asymmetrical test mark is imaged, the images of the sub-strips 37 in FIG. 6C are widened and those of the sub-strips 38 are narrowed so that the total area of the latent image of the test mark $M_3$ acquiring a different refractive index is enlarged and the asymmetry of, or displacement of the point of gravity in the latent image will even be larger.

It has been found that the extent of asymmetry in the latent image is dependent on the extent to which the projection beam is satisfactorily focused on the substrate+photoresist and on the illumination dose. The maximum asymmetry, hence the maximum offset in the alignment signal which is thus the latent-image detection signal, occurs if the projection beam is sharply focused. When the projection beam is defocused, the images of the subdivided strips 35 of the test mark will become vaguer, i.e. these images acquire less contrast and the higher frequencies disappear. When the defocusing increases, the latent image of the test mark becomes more symmetrical so that the offset in the alignment signal disappears.

FIGS. 7a and 7b show the variation of this offset, i.e. that of the latent-image detection signal, as a function of the focusing $\Delta z$ for the strips of the latent image extending in the X direction and Y direction, respectively. The defocusing $\Delta z$ is plotted in µm on the horizontal axis and the offset of the alignment signal, i.e. the focus error signal is plotted in nm on the vertical axis. The curves shown are obtained by imaging the same test mark a number of times, each time at a different focusing of the projection lens system, in the photoresist. These curves apply to latent images on the optical axis of the projection lens system. The curves have a clock shape and the signals have an extremum which is at 600 nm for the X direction and at 690 nm for the Y direction for the example shown. A negative value for the offset or latent-image detection signal AOS means that the substrate is too close to the projection lens system and a positive value means that the distance between this system and the substrate is too large.

Figure 8A:
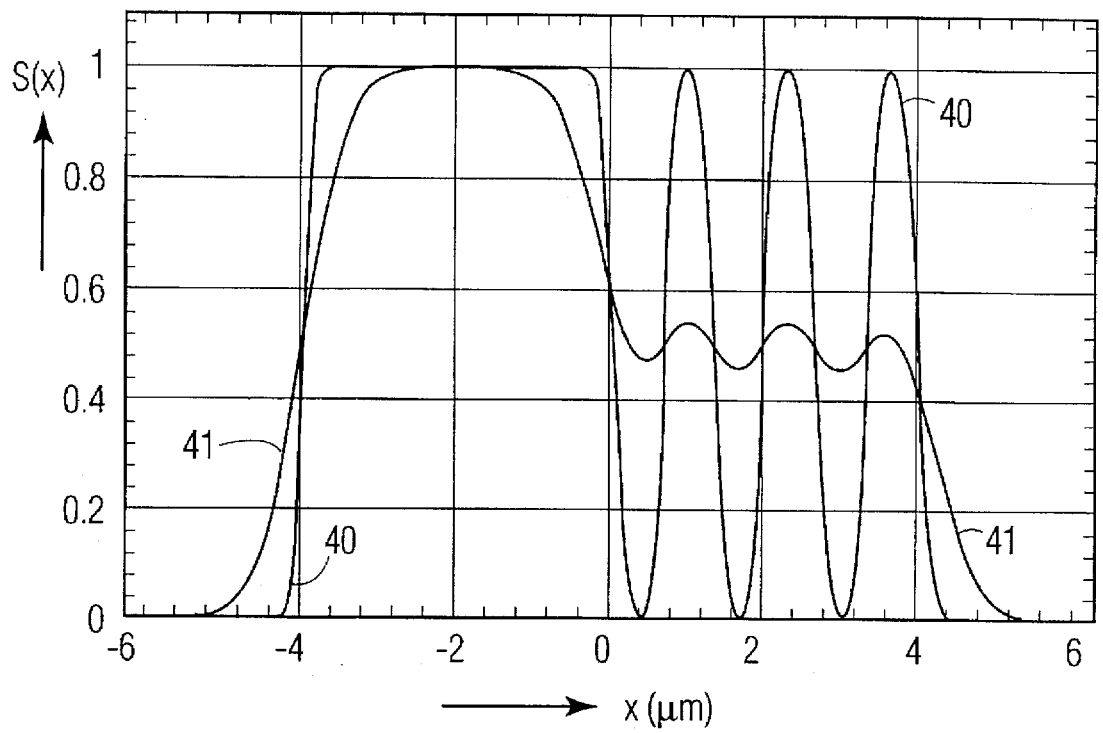
FIGS. 8a and 8b show signals obtained when scanning an aerial image and a latent image, respectively, formed in a photoresist of the test mark according to the invention.
Figure 8B:
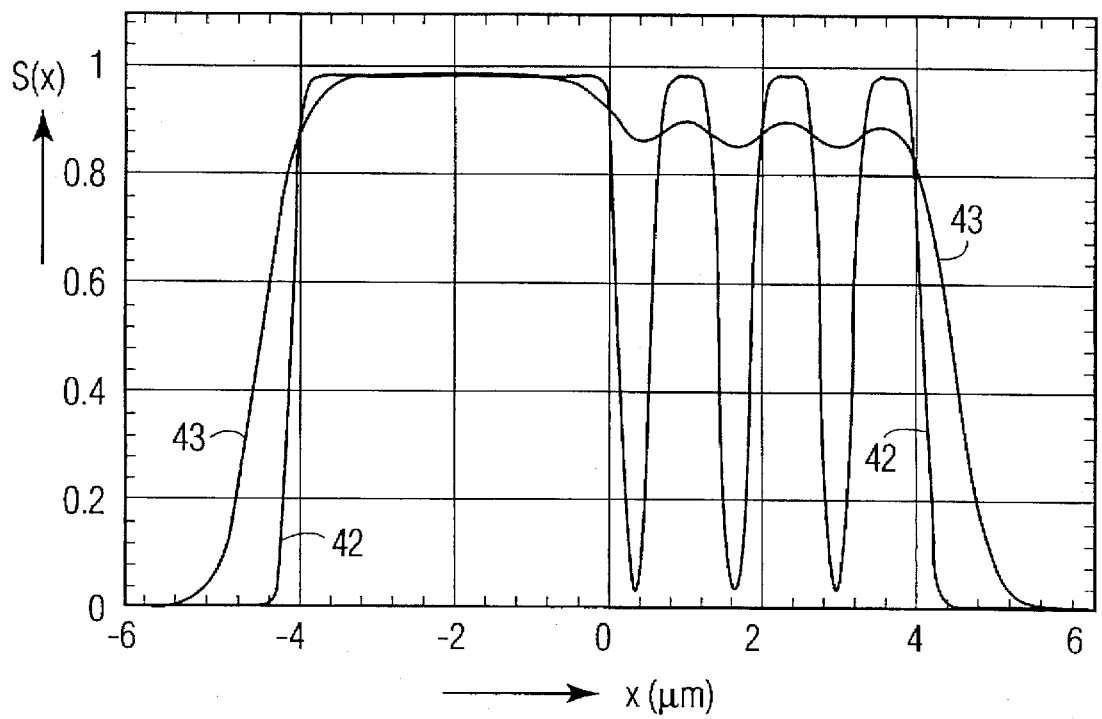

The effect of imaging the asymmetrical test mark in a photoresist may be elucidated with reference to FIGS. 8a and 8b which relate to the image formed in air, or aerial image, and on the image formed in the photoresist, or the latent image. In FIG. 8a the computed signal S(x) is shown, which signal is obtained when scanning a strip 35 of FIG. 6 for two focus values: $\Delta z=0$, curve 40, and $\Delta z=2$ µm, curve 41. It appears that upon defocusing the symmetry of the aerial image does not change, so that this image is not suitable for measuring a focus error on the basis of symmetry variation. FIG. 8b shows the computed signal S(x) which is obtained when scanning the latent image formed in the photoresist for the same focus values. The curve 42 applies to $\Delta z=0$ and the curve 43 applies to $\Delta z=2$ µm. Now there is clearly a variation. At $\Delta z=0$ the signal, hence the latent image is asymmetrical. At $\Delta z=2$ µm the signal is almost symmetrical. It has been found by experiment that the offset between the aerial image and the latent image is approximately 300 nm at a defocusing of $\Delta z=2$ µm, an offset which can easily be observed by means of the alignment device.

In the manufacture of ICs having a very large number of components the projection beam should have a very short wavelength, for example of the order of 240 nm. Radiation having such a wavelength is referred to as deep UV radiation. Special photoresists, known as deep UV resists, have been developed for this radiation, and they have a different composition than the more conventional photoresists which are used for projection beam radiation of longer wavelengths, for example 365 nm. To obtain a satisfactory latent image in a deep UV resist, such a photoresist is preferably heated after it has been illuminated, so that the desired refractive index differences, hence optical path length differences are produced in the photoresist. This process is known as "Post-Exposure Baking" (PEB) and the image obtained is known as the PEB image. It will be evident that the method according to the invention can also be used for such a PEB image.

The invention may also be used for developed test-mark images which are obtained by removing the substrate from the projection apparatus after it has been illuminated, developing it so that the illumination index variations are converted into a height profile, hence phase structure, and subsequently placing it in the apparatus again, whereafter the test-mark image can be detected and examined. The advantage is then maintained that a test-mark image is measured in the same apparatus as the one in which this image has been formed. This is a more rapid process than the conventional measuring process by means of, for example an optical microscope or an electron microscope. When developed test-mark images are measured, detector signals are obtained which have larger amplitudes than the signals obtained when latent test-mark images are measured. Measuring developed test-mark images is particularly important when deep UV resists are used.

Before the asymmetry in the test-mark image can be detected, this image must first be correctly positioned in the alignment device, hence it must be aligned. If the position of the test mark in the mask is known, the global alignment marks $M_1$, $M_2$ and $P_1$, $P_2$ in the mask and the substrate, respectively, can be used for this alignment. After the mask and the substrate have been aligned with respect to each other by means of these marks and in the way as described with reference to FIG. 3, the test mark is imaged in the photoresist. Subsequently the substrate table is moved under the control of the very accurate interferometer system in such a way that the formed test-mark image, latent or developed, in the aligned state is positioned under a global alignment mark of the mask.

However, for aligning a, for example latent, image of a test mark use is preferably made of an extra alignment mark associated with the test mark, which extra mark is located close to the test mark in a test mask. This alignment mark is imaged simultaneously with the test mark so that not only a latent image of the test mark but also a latent image of the alignment mark, or a latent alignment mark is formed in the photoresist. After the latent alignment mark has been aligned with respect to the associated extra alignment mark in the mask, the substrate table only needs to be moved over a small distance of the order of 1 mm so as to position the latent image of the test mark correctly with respect to said extra alignment mark. This procedure may, of course, also be performed with developed, or PEB test-mark and alignment-mark images.

Figure 9:
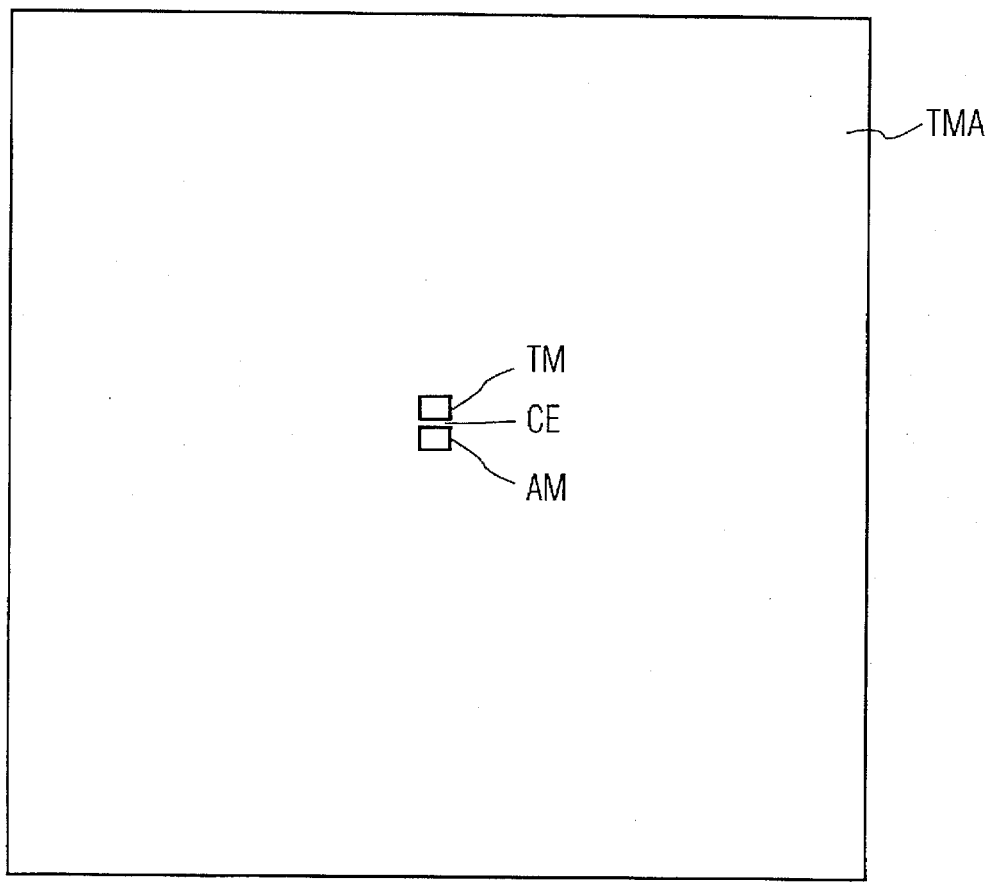
FIG. 9 shows a first embodiment of a test mask.

FIG. 9 shows a test mask TMA provided with an extra alignment mark AM in the close proximity of a test mark TM. These marks are provided, for example in the centre CE of the mask.

This test mark may be used, for example for determining the best focusing of the projection lens system by imaging the mark a number of times, each time with a different focusing, in the photoresist and by determining at which focusing a maximum asymmetry is observed in the latent image.

The result of this focus measurement can be used for adjusting the focus of the projection lens system before a production projection process is started, or at given calibration instants in such a process. During the production projection process the focus may, however, vary, particularly in the novel projection lens systems which have a large resolving power and a relatively large image field. With these projection lens systems it is possible to image line widths of the order of −0.4 µm in an image field of the order of 25 mm, but these projection lens systems are very sensitive to variations of the ambient parameters such as air pressure and temperature and show heating effects during the start of a projection process. Due to the high dispersion of the lens material, a variation of the wavelength of the projection beam further influences the imaging quality, i.e. the position and the quality of the image formed with this beam. Problems with distortion, field astigmatism and field curvature may arise in the projection apparatus. The novel generation projection lens systems having the very high resolving power and a relatively large image field have a very small depth of focus so that focus errors, inter alia due to the larger wavelength dependence of the projection lens system, have an ever increasing influence. These errors should be detected very accurately.

To this end the projection apparatus comprises a focus error detection device FD as described with reference to FIGS. 4 and 5. Since the radiation path covered by the focus measuring beam $b_F$ is different from that of the projection beam and since these beams have wavelengths which differ considerably, variations of, for example ambient parameters such as temperature have a different effect on the images formed with the projection beam and the focus measuring beam, respectively. Consequently, a satisfactory focusing may be measured with the focus error detection device, whereas the image of the mask formed by means of the projection beam is not sharp. Moreover, particularly when a narrow band focus measuring beam is used in a focus error detection device, this device may supply different focus error signals at the same focusing but at different thicknesses of the photoresist. A mechanical drift in the projection apparatus, which cannot be detected by means of the focus detection device, may also occur. It is therefore necessary to periodically calibrate the focus error detection device, for example once or several times a day.

The result of the focus measurements on test-mark images may be used for this calibration. To this end, the focus error detection device is also used for measurement during the measurement of each test-mark image. The results of these measurements are stored in a memory. After it has been ascertained which test-mark image is sharpest, it is looked up which focus value has been measured for this image by the focus error detection device. If this value does not correspond to the value measured by means of the test-mark image detection device, the zero point of the focus error detection device may be adapted.

The contrast of the test-mark image consisting of a number of strips and formed in the photoresist, which test mark may be assumed to be a grating, depends on the quantity of radiation energy absorbed by the photoresist at a given thickness of this resist and used for activating this resist. The quantity of energy applied to this resist is linearly dependent on the radiation power of the source LA (FIGS. 1 and 5) and on the time interval during which a shutter present in the projection apparatus is open. The quantity of energy absorbed by the photoresist depends on the reflection coefficient of the upper face of the photoresist. The larger this reflection coefficient, the less energy is available for activating the photoactive component in this resist. The optical thickness of this resist, i.e. the product of its geometrical thickness and its refractive index also determines the reflection coefficient. To be able to make satisfactory images of the mask pattern by means of the projection apparatus, it is therefore necessary to satisfactorily adjust and periodically measure the illumination dose and hence the quantity of energy absorbed by the photoresist.

Figure 10:
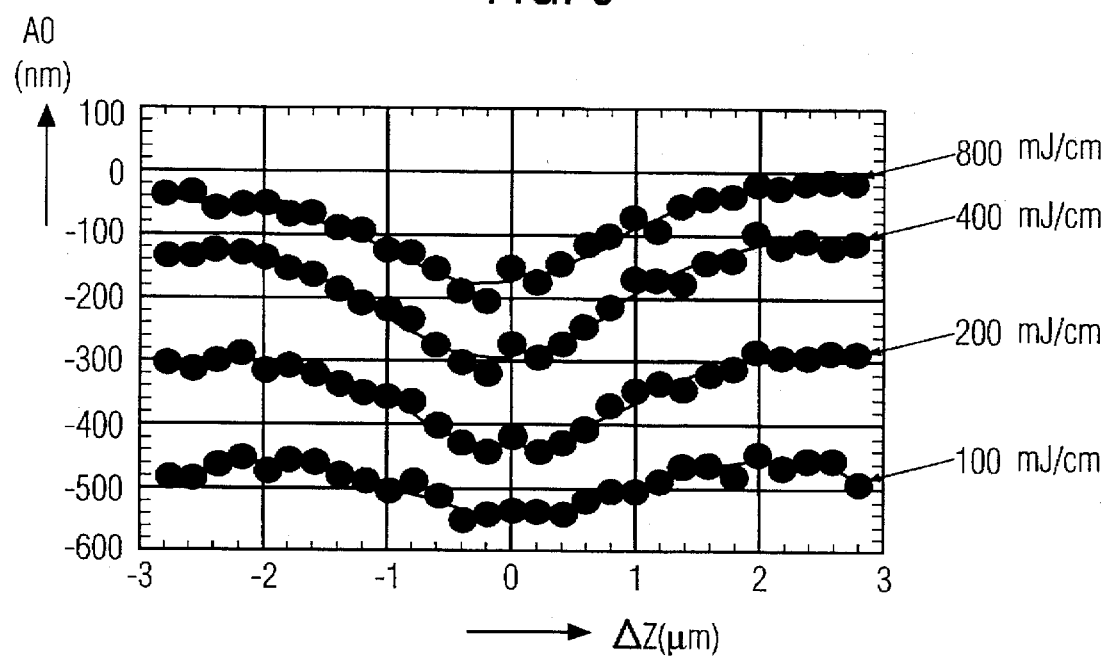
FIG. 10 shows the variation of the latent-image detection signal as a function of the defocusing for different quantities of illumination.
Figure 11:
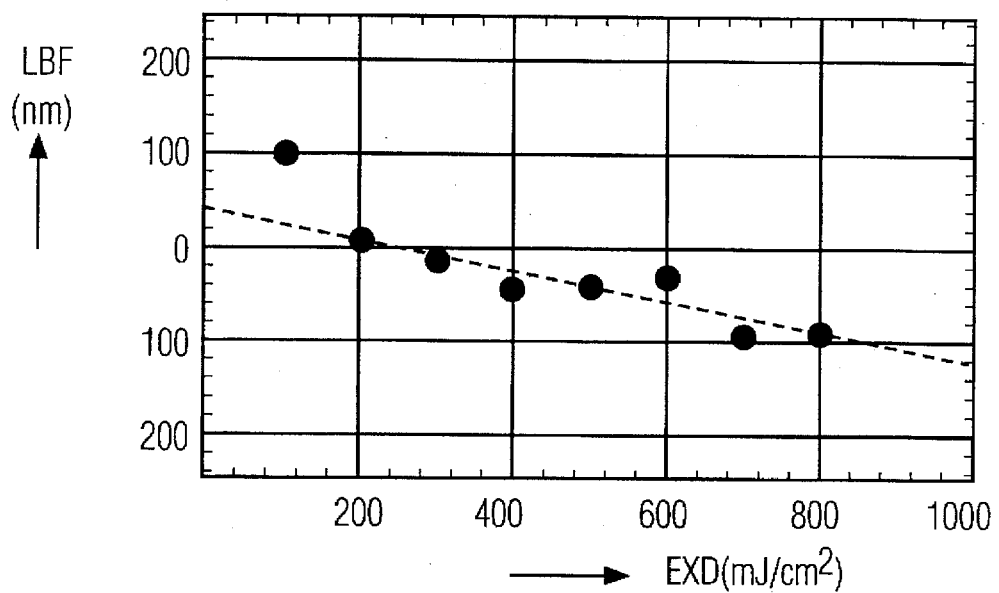
FIG. 11 shows the variation of the best focusing with the illumination dose.
Figure 12:
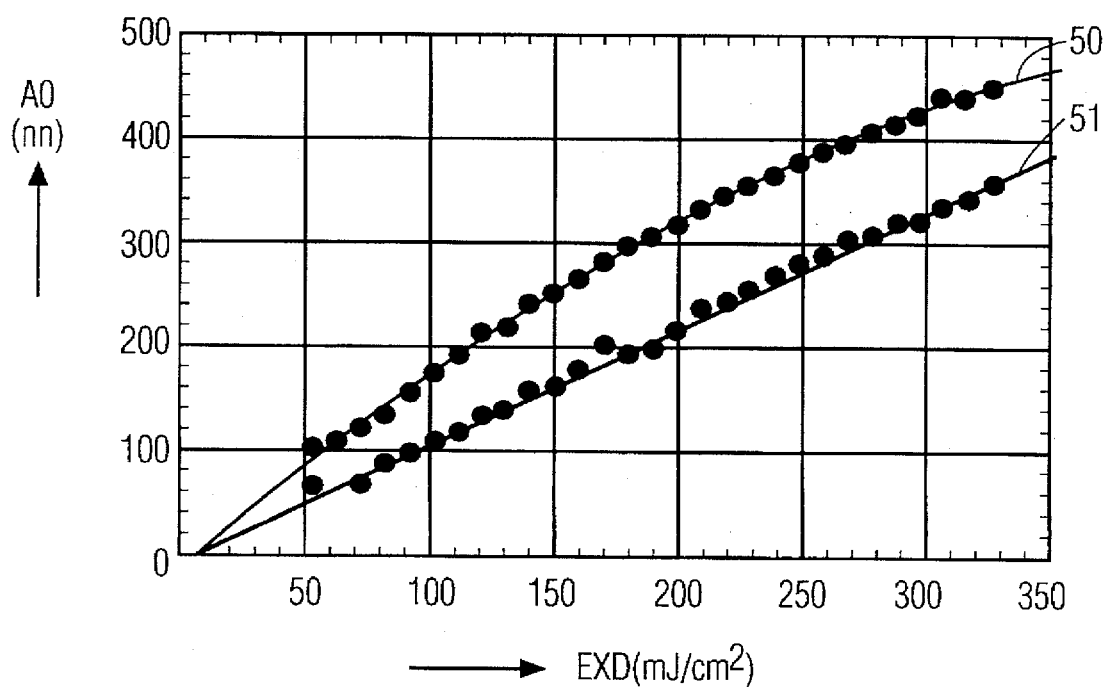
FIG. 12 shows the latent-image detection signal as a function of the illumination dose for two different photoresists.

FIGS. 10, 11 and 12 show that the focus error signal obtained of a latent image and the signals derived therefrom are independent of the illumination dose, but the detection signal itself, hence the offset of the alignment signal is dependent on this dose. FIG. 10 shows the variation of this offset AO as a function of the defocusing Δz for different illumination doses. At an increasing illumination dose the clock-shaped curves essentially retain their shape; the minima will become a little deeper and the level of the curves will be higher. It is important that the measured focusing for which a maximum offset occurs in the alignment signal, i.e. the measured best focusing is substantially independent of the illumination dose. Consequently, the values obtained via the latent-image detection of parameters such as the best focusing, field curvature and astigmatism are substantially independent of the illumination dose.

To illustrate this, FIG. 11 shows the best focusing values LBF plotted on the horizontal axis and associated with different illumination doses EXD. The solid line obtained by best curve fitting has only a faint slope of less than 0.2 mm/m Joule. Within the measuring accuracy used, the other parameters are not dependent on the illumination dose. Since the focus measurement by means of the latent-image detection according to the invention is independent of the energy applied to the photoresist, it can be concluded that this measurement is also independent of variations in thickness of the photoresist and of local variations in the reflection coefficient of the substrate or process coatings provided thereon.

On the other hand, at a fixed focusing, the offset AO in the alignment signal is dependent on the illumination dose as is shown in FIG. 12. The curves 50 and 51 shown in this Figure for two different types of photoresists are obtained by varying the illumination dose each time with a value $\Delta_{EXD}=$ 10 mJ/cm² at the best focusing.

The fact that for each illumination dose a given value of the latent-image detection signal AOS, hence a given value of the offset AO of the alignment signal is associated with each illumination dose can be used for regularly measuring and possibly correcting the illumination dose during a production projection process. To this end, an optimum illumination dose obtained in the conventional manner is used as a basis by making test images of a mask pattern with different illumination doses in a photoresist, developing this resist and observing the images by means of a SEM. It can be ascertained by means of a curve as shown in FIG. 12 which offset AO of the alignment signal is associated therewith. During the production projection process it can be checked at regular instants whether this offset is indeed achieved. If this is not the case, the illumination dose may be adapted in known manner.

To have a reliable measurement of the illumination dose, particularly when the latent-image detection signals are small, a table of different illumination doses and associated line widths in the images can be made and stored in the signal processing unit of the projection apparatus from the data obtained in the conventional test image measurement by means of the SEM. If such a table is available, an illumination dose may be allocated to an offset value obtained from a latent-image detection and the deviation with respect to the desired illumination dose can then be determined. The illumination dose measurements described above may also be performed with developed or PEB testmark images.

By making use of an extra alignment mark associated with the test mark, the known alignment device may be calibrated. To this end it is ascertained whether the signal obtained in aligning the, for example latent, image of the extra alignment mark with respect to this alignment mark corresponds to the signal obtained in aligning a mask alignment mark ($M_1$, $M_2$) with respect to a substrate alignment mark ($P_1$, $P_2$). If this is not the case, the last-mentioned signal may be given an offset in conformity with the difference found.

Analogously as described in said article in Spie vol. 1674 Optical/Laser Microlithography 1992 pp. 594–608, a possible distortion of the projection lens system can be measured by means of an extra symmetrical alignment mark associated with an asymmetrical test mark.

For these and other measurements test marks and alignment marks provided in a production mask may be used, which marks are provided at such positions that they are imaged in substrate areas which are known as scribe lines between IC areas. When imaging the marks, for example the IC pattern in the mask is covered.

As is apparent from a comparison of FIGS. 7a and 7b, the extrema of the curves representing the alignment signal offset as a function of the defocusing are slightly shifted with respect to each other. This is caused by the astigmatism of the projection lens system. Measurements which are initially intended for determining the best focusing may thus also yield an indication about the astigmatism of the projection lens system.

Figure 13:
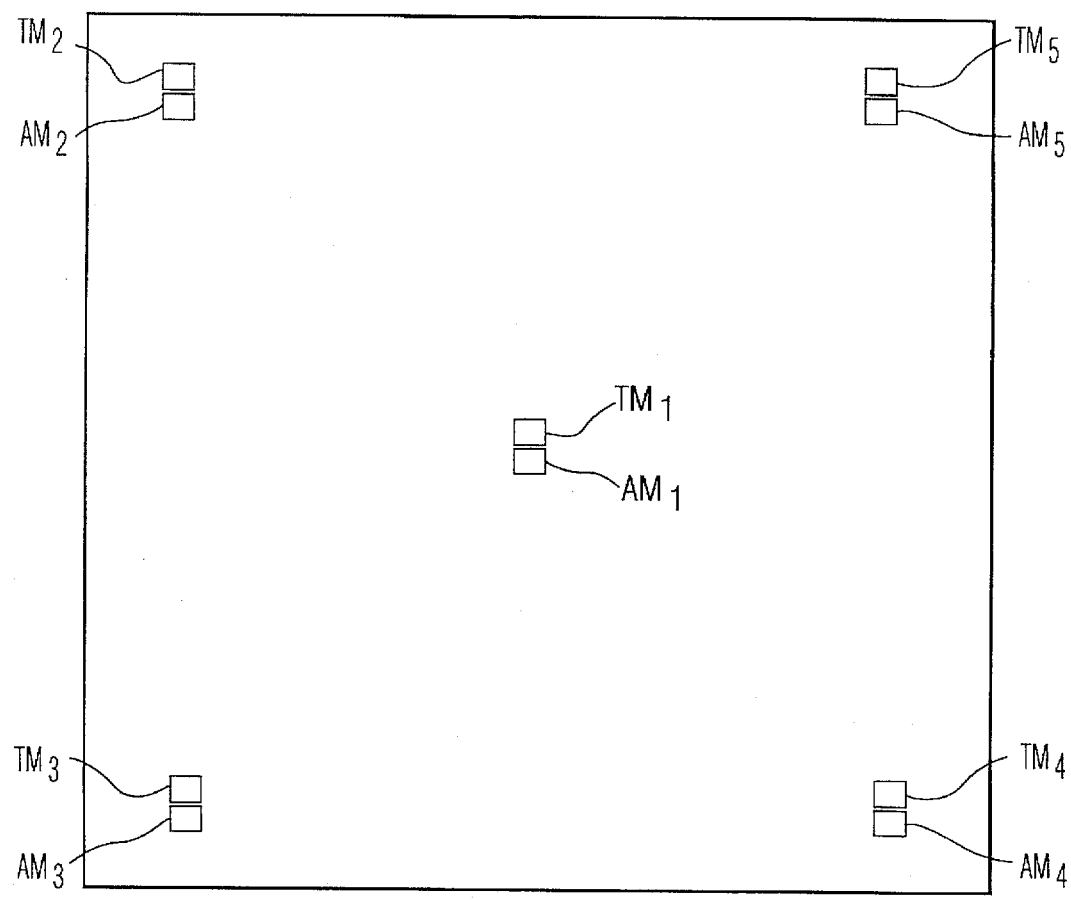
FIGS. 13 and 14 show two further embodiments of a test mask according to the invention.

In the measurements described so far a test mark is used which is imaged a number of times in the same IC area or in different IC areas for determining, for example the best focusing. However, preferably use is made of a test mask in which in addition to, or instead of, a test mark in the centre at least three test marks are provided outside the centre. FIG. 13 shows a mask having a test mark $TM_1$ in the centre and four test marks $TM_2$–$TM_5$, each at one of the corners, as well as the extra alignment marks associated with these test marks.

By imaging such a mask with three or five test marks a number of times in the photoresist in different IC areas, each time at a different focusing, and by determining the best focusing for each of the test marks and comparing these with each other, data about the quality of the projection lens system can be obtained in the manner as described in U.S. Pat. No. 5,144,363 describing a projection apparatus with an image detection device of a different type. For example, the tilt of the image formed with the projection radiation can be determined. This information can be used for calibrating a tilt detection device to be built into a novel generation projection apparatus, which detection devices operate with a difference from the projection radiation and are based on the autocollimation principle. In addition to information about said tilt, information about the magnification, the astigmatism and the third-order distortion can also be obtained.

An important part of this distortion is the radial distortion, i.e. the difference between the magnification, measured in a radial direction, in the centre of the image field and that at another point of the image field.

Figure 14:
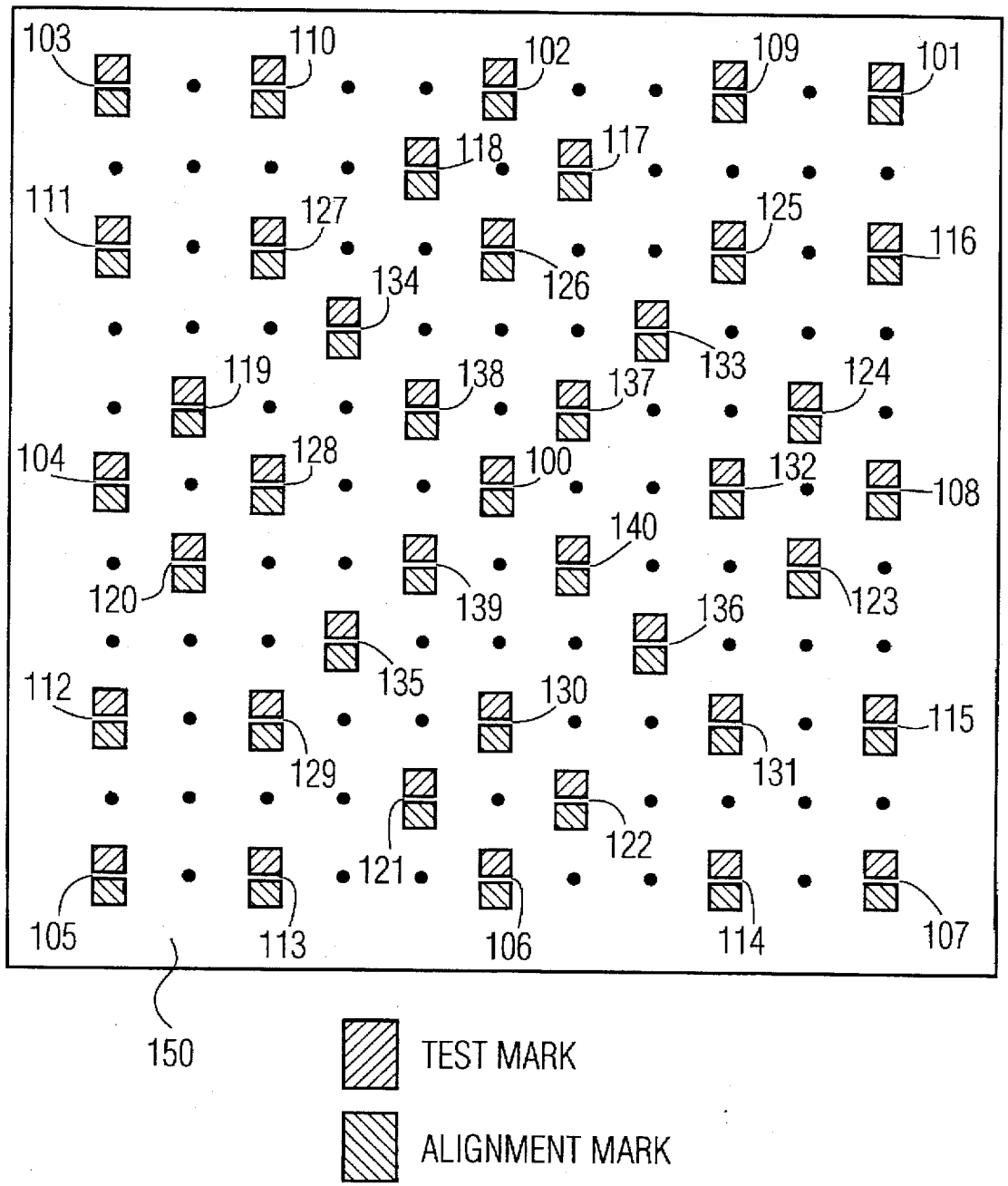

FIG. 14 shows an embodiment of a test mask having a large number of, forty-one, test marks and associated extra alignment marks, each pair being denoted by one reference numeral: 100–140. The line 150 in FIG. 14 represents the field of the projection lens system, which field is, for example 14×14 mm². If further pairs of an alignment mark and a test mark are provided at the positions denoted by dots in FIG. 14, a test mask having one hundred and twenty-one pairs of marks is obtained which is suitable for an existing projection apparatus in which a special alignment program is used which is adapted to an existing alignment mask having a large number of alignment marks. The test mask of FIG. 14 has the same number of test marks as the existing alignment mask has alignment marks. The advantage of the test mask of FIG. 14 is that a number of projection lens parameters such as tilt and field curvature can be determined thereby.

The test-mark pattern of FIG. 14 is imaged a number of times, for example 29 times in the photoresist, each time in another IC area at which the focusing each time changes, for example 0.2 µm between Z=−2.8 and Z=+2.8 µm, whereafter the, for example latent, images of all marks are measured, i.e. their aligned positions are fixed and stored by means of the substrate table position detection device. Thus, 41×29×2=2378 alignment positions are fixed.

Since images of the test marks are formed in a large number of, for example twenty-nine areas of the substrate, an averaging operation is performed during the detection so that the measurements are not influenced by deviations of the substrate such as unevennesses.

Said defocusing steps need not be equal. Preferably these steps are smaller as the extremum in, for example FIGS. 7a and 7b is approached so that it is possible to measure more accurately and the best curve fitting will be better possible. The varying step size principle may also be used when determining the illumination doses.

It is to be noted that the curves shown in FIGS. 7a and 7b apply to the mark 100 on the optical axis. Similar information can be obtained for all other mark pairs 101–140. Two focal surfaces for the X and Y directions can be derived from the total information. If the projection lens system exhibits astigmatism, the focal surfaces $FS_x$, $FS_y$ are different. An average focal surface $FS_M$ can then be derived in accordance with:

$$FS_M = 0.5\,(FS_x + FS_y)$$

Figure 15:
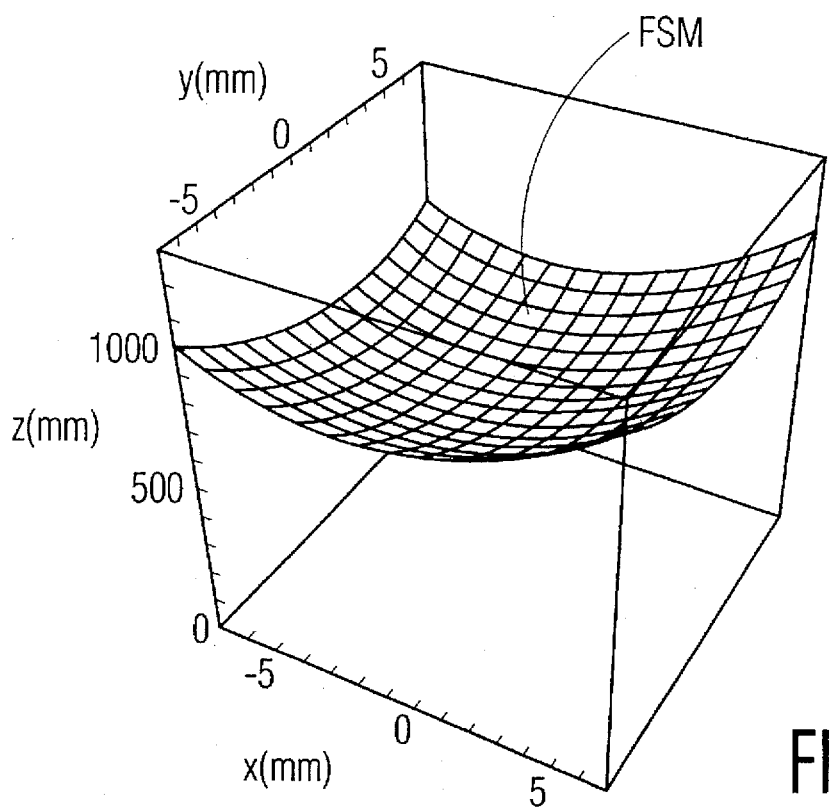
FIGS. 15 and 16 show the focal plane and the astigmatic plane of a projection lens system measured by means of the latent-image detection.
Figure 16:
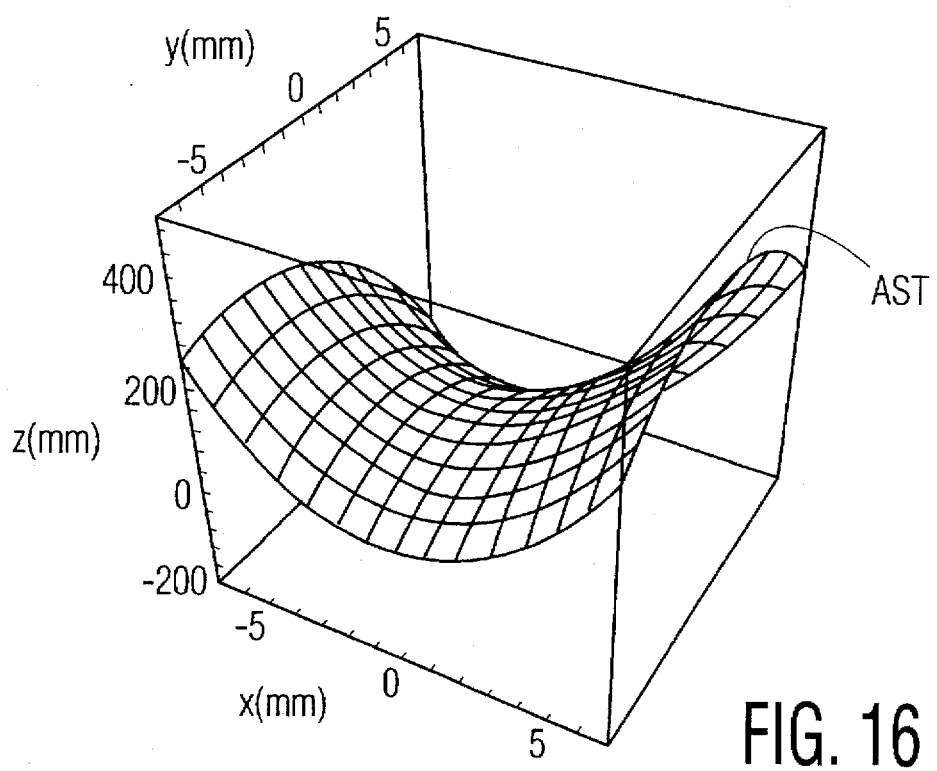

Such a surface is shown in FIG. 15, while FIG. 16 shows the associated astigmatism $AST = FS_x - FS_y$. For the specific projection lens for which the measurement has been performed, the maximum astigmatism is approximately 390 nm and occurs along the X axis, for X=6.5 mm.

If the focal surfaces $FS_x$ and $FS_y$ are known, the substrate may be manipulated during the production projection process, such that the local substrate surface fits the local focal surface as satisfactorily as possible. To this end, the IC areas on the substrate are smaller than the image field of the projection lens system so that some manoeuvring space is left for the IC areas.

A focal surface is the collection of best foci within the projection lens image field, in other words the points for which the maximum offset occurs in the alignment signal.

FIG. 17 shows the result of a known distortion measurement performed with the test mask of FIG. 14. To this end the alignment data of the extra alignment marks are used for the best focusing. The local distortion of the projection lens system is the difference between the position where the mark is actually imaged and the position where the mark would be imaged if the magnification of the projection lens system were correct, independent of the position in the image field. FIG. 17 shows the result, obtained after intermediate operations, of the distortion measurements, in which errors in the mask in the form of vectors, 200–240, have not been taken into account. A vector length of 2.8 mm represents a distortion of approximately 100 nm. By definition, the distortion on the optical axis, position 200, is zero. For the measured projection lens system the largest distortion is approximately 170 nm, for vector 203.

The image detection of an asymmetrical test mark may also be used for measuring unevennesses of the substrate plus the photoresist, hence for performing a kind of height measurement. To this end, for example the test mark, possibly together with an associated extra alignment mark, is imaged a number of times, each time at a different focusing, in an IC area and this multiple image is repeated in a number of IC areas, spread across the entire substrate. Via the latent-image detection the best focusing is determined for each IC area. By comparing these settings for the different areas with each other, substrate unevennesses can be found.

One of the advantages of the latent-image detection is that the images are measured in the apparatus with which these images have been formed. This advantage is maintained if the substrate plus the photoresist is developed after images of the test mark have been formed therein and is placed in the projection apparatus again for measuring the then developed images by means of the alignment device. This process is more rapid than the conventional measuring process by means of a SEM and supplies detector signals having larger amplitudes than the signals from pure latent images.

The reference mark for a test mark may not only be a symmetrical extra alignment mark as described hereinbefore, but also an asymmetrical mark whose asymmetry is opposed to that of the test mark. FIG. 18A–18C show diagrammatically such a reference mark RM and the associated test mark TM. In the image detection each of these marks is first aligned with respect to a symmetrical alignment mark, for example a global alignment mark and subsequently the offset in the alignment signal is determined for each mark. By subtracting the detector signals of the two asymmetrical marks, a signal is obtained whose variation due to the asymmetry in the mark is, in principle twice as large than when only the test mark is asymmetrical.

By detection of images of the described asymmetrical test marks, not only information about the position, the rotation and the tilt of the latent image but also information about the variations in imaging quality, notably the magnification, astigmatism, distortion and field curvature due to variations in the wavelength of the projection beam and variations of the ambient parameters such as air pressure, temperature and the like can be obtained. It is then not necessary for all parameters influencing the imaging quality, i.e. the ambient parameters, the wavelength of the projection beam, the mechanical drift and so on to be exactly known, but the computer incorporated in the projection apparatus may ascertain by means of the detector signals that the image formed by the projection lens system is not correct and then generate setting signals for the various servo devices and control signals for the apparatus parameters, such as wavelength, gas pressure and temperature in the projection lens and so forth via a model in which all influencing parameters are included, so that the position and quality of the projected image will be optimal.

The test-mark image detection device provides the possibility of accurate measurement and correction. In a projection apparatus with a projection beam whose wavelength is in the far ultraviolet range, for example 248 nm, it should be possible to measure instabilities in the X and Y direction of the order of 5 nm and instabilities in the Z direction of the order of 50 nm. In a projection apparatus in which the influencing parameters themselves should be measured and compared with reference values, the temperature, the wavelength, the Z position of the mask and the air pressure should have to be measured with an accuracy of 0.015° K., 0.5 nm, 0.15 µm and 0.5 millibar, respectively. If it is at all possible to achieve these measuring accuracies, very sophisticated measuring techniques should be used for that purpose. Moreover, the measuring values should be converted for aberrations of the projection lens system, with the additional requirement that no inhomogeneities should occur in this system. Moreover, the mechanical drift in the projection apparatus has not been taken into account.

Figure 19:
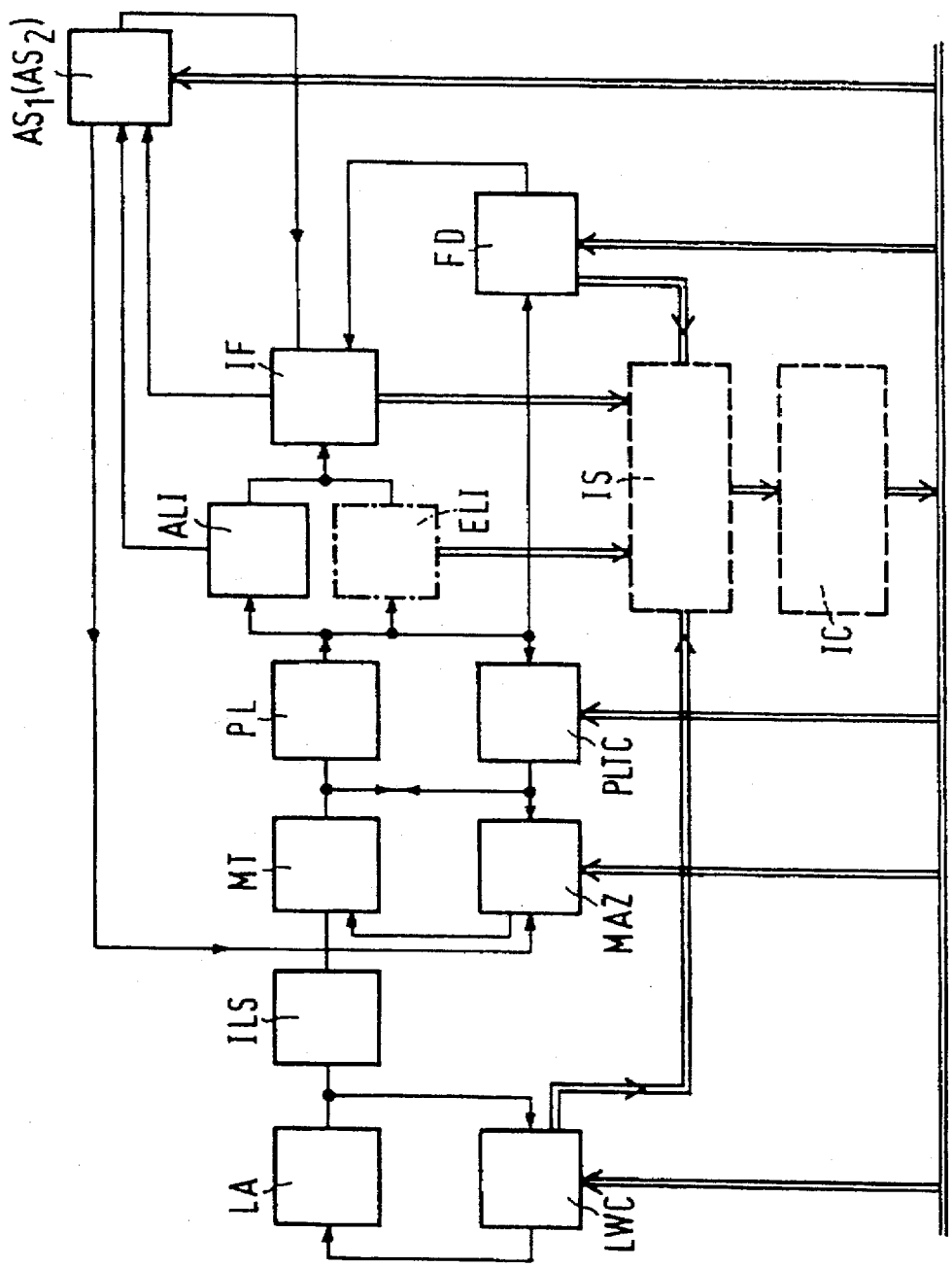
FIG. 19 shows a diagram of the different test devices of the projection apparatus and the connections between these devices.

FIG. 19 shows a diagram of the servo devices and their interconnections used in the projection apparatus. The single connection lines between the different devices shown by way of blocks are also present in known projection apparatuses. These blocks are:

LA, the radiation source, for example a laser,

LWC, a laser wavelength control device,

ILS, the illumination system,

MT, the mask table,

MAZ, a device checking the Z position of the mask table,

PL, the projection lens,

PLTC, a device controlling the temperature of the projection lens,

ALI, the image formed by means of alignment radiation,

IF, the substrate table position detection device,

FD, the focus error detection device, $AS_1$ ($AS_2$) the single (or double) alignment device.

The sub-systems shown in broken lines are arranged as extra systems in the projection apparatus:

ELI, the latent image formed by means of the projection radiation,

IS, the latent-image detection device, and

IC, the image calibration device, or the computer.

The double connection lines represent the extra signals which are processed when using the latent-image detection device. These are:

the signals of the substrate table position detection device IF, the wavelength control device LWC and the focus error detection device FD which are applied to the image detection device.

the image information of the image formed with projection light.

signals of the image calibration device which are applied to the laser wavelength control device LWC the mask height control device MAZ the projection lens temperature control device PLTC the focus error detection device, and the alignment device $AS_1$ ($AS_2$).

The projection apparatus may comprise one or more of the following devices:
- a device (PLPC) for controlling the pressure in the projection lens system,
- a device (PLGM) for controlling the composition of the medium in the projection lens system,
- a device (PLDC) for controlling the mutual distances between the lens elements.

The devices PLPC, PLGM and PLDC are controlled from the device IC, analogously as the device PLTC.

FIGS. 20A,B shows a further embodiment of a one-dimensional test mark with strips 305 and intermediate strips 300, in which the strips 305 are sub-divided again into a part 306 which is transparent to the projection beam radiation and a part which consists of a succession of transmissive sub-strips 307 and non-transmissive sub-strips 308. This embodiment differs from that in FIG. 6A–6C in that the direction of the sub-strips 307 and 308 extends at an acute angle, for example an angle of 45°, to the direction of the strip part 306. In addition to measurements of said projection lens parameters, this test mark is notably suitable for measuring astigmatism at an acute angle, for example an angle of 45°, to the X and Y directions.

The test mark in FIG. 20A,B may be used in combination with an extra alignment mark which has a mirrored asymmetrical structure analogous to the combination of FIGS. 18A–C. FIGS. 21A–C show the novel combination, in which TM is the test mark and RM is the reference mark, or extra alignment mark.

FIG. 22 shows a further embodiment of the test mark, which differs from the one mentioned hereinbefore in that the strips 325 have a larger width W1 than the width W2 of the opaque intermediate strips 320. This test mark thus has an extra coarser asymmetry which enhances the effect of the asymmetry due to the sub-strips 327 and 328.

FIGS. 23A–C show an embodiment of a two-dimensional test mark 329 which is particularly suitable to be imaged in the scribe line of a substrate. This mark consists of a part 330, whose strips 331 extend in the X direction, and a part 335 whose strips 336 extend in the Y direction. As is shown in the insets, the strips 331 again consist of a transparent part 332 and transparent sub-strips 333 alternating with opaque sub-strips 334, while the strips 336 consist of a transparent part 337 and transparent sub-strips 338 alternating with opaque sub-strips 339. The test mark is, for example 220 µm long and 80 µm wide. In a projection with a 5× reduction, the test-mark image is 40µm long and 10 µm wide, so that this image satisfactorily fits in a scribe line.

FIG. 24A–C show an embodiment of a test mark 340 which is particularly suitable for measuring illumination doses. This mark comprises, for example four gratings 340–344. The strips 345 of each grating again consist of a transparent part 347 and a part 348 which has a plurality of transparent sub-micron areas 349 in an opaque underground. The sub-micron areas, which have dimensions of the order of, for example 0.2 µm, cannot be imaged separately by the projection lens system and jointly constitute a grey filter which transmits, for example 30% of the incident radiation.

In the projection of the strips 345 in the photoresist, strip-shaped areas 350 are produced, whose left-hand part receives a higher intensity than its right-hand part. The point of gravity, indicated by the arrow 351, of the intensity distribution in the image strips 350 has shifted to the left with respect to the point of gravity, indicated by the arrow 361, of the images 360 of the strips 355 of a reference mark RM. When the illumination dose is increased, the quantity of radiation transmitted through the strip part 348 to the photoresist increases, whereas the part of the photoresist illuminated via the strip part 347 is saturated, so that the point of gravity of the intensity distribution shifts to the right. At a sufficiently large illumination dose, the point of gravity will be in the middle of the image strips 350, which is indicated by means of the arrow 352. Since the quantity of the illumination dose is converted into a position of the point of gravity of the energy distribution within the strip images, illumination doses can also be measured by means of the alignment device of the projection apparatus.

Instead of the four-pan test mark 340 shown in FIG. 24A, a test mark having two gratings whose grating strips extend in the X and Y directions, respectively, or a test mark having only one grating may be alternatively used for the illumination dose measurement. This measurement may be performed with latent images, PEB images, or developed images. The strips 345 may have a width which is equal to or larger than that of the intermediate strips 346. Moreover, the strips of the reference mark, which is used in combination with the special test mark for illumination dose measurement, may also comprise a grey area consisting of sub-micron areas, in which the structure of the strips of the reference mark is the image mirrored about the Y axis of that of the strips of the test mark, so as to obtain a stronger signal analogously as described with reference to FIG. 18. The sub-micron areas may not only have the square shape shown in FIG. 24, but also other shapes, such as a triangular or circular shape, or they may consist of very thin lines.

Figure 25:
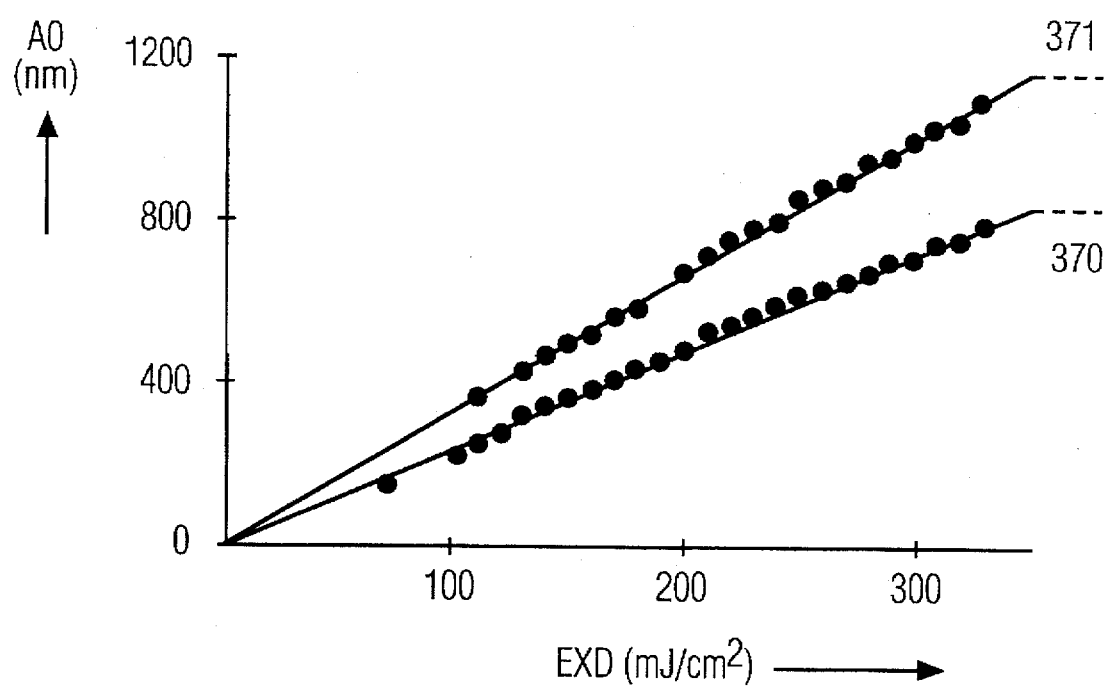
FIG. 25 shows the offset of the centre of the test-mark image as a function of the illumination dose for two different test marks.

FIG. 25 shows the offset AO (in nm) of the image centre, as a function of the illumination or exposure dose EXD in $mJ/cm^2$ for a test mark whose strips 345 are as wide as the intermediate strips 346, curve 370, and for a test mark whose strips are approximately 25% wider than the intermediate strips, curve 371.

It has been found that the illumination dose measurement is substantially not influenced by focus errors which are not too large.

The invention has been described with reference to its use in an apparatus for repetitively imaging and/or scanning a mask pattern on a substrate for manufacturing integrated circuits (ICs). Such an apparatus may alternatively be used for manufacturing integrated optical systems or planar optical systems, guidance and detection patterns for magnetic domain memories or a structure of liquid crystal display panels. Though the invention is primarily intended for these apparatuses, it is not limited thereto. It may generally be used in optical measuring and inspection apparatuses in which the quality of an imaging lens system should be determined very accurately.

We claim:

1. A method of repetitively imaging a mask pattern, provided in a mask table, on a substrate provided in a substrate table, by means of a projection beam, which method comprises the following steps:

providing a mask having at least one test mark in the mask table, which test mark has a periodical structure of strips alternating with intermediate strips which are non-transmissive to the projection beam radiation;

providing a substrate having a radiation-sensitive layer in the substrate table;

projecting the image of at least one test mark of the mask in the radiation-sensitive layer by means of the projection beam and a projection system;

detecting said image by means of an alignment device for aligning an alignment mark of a mask with respect to an alignment mark of a substrate;

setting at least one parameter influencing the quality and position of the mask pattern image by means of the output signal of the test mark-image detection device, and repetitively imaging a production mask pattern at consecutive, different positions on a production substrate, characterized in that use is made of a test mark whose strips are partly non-transmissive to the projection beam radiation and partly consist of a plurality of sub-strips which are alternately transmissive and non-transmissive to the projection beam radiation, and in that the test mark-image detection consists of, first, aligning the test-mark image with respect to a mask mark and subsequently detecting a change in the asymmetry of the test-mark image caused by a parameter to be measured and interpreted by the alignment device as a shift of said image.

2. A method as claimed in claim 1, characterized in that the latent image formed by imaging the testmark in the photoresist is detected by means of the alignment device.

3. After the test mark has been imaged in the photoresist, a method as claimed in claim 1, characterized in that the substrate is removed from the substrate table, subsequently developed and then placed on the substrate table again whereafter the developed test-mark image is detected by means of the alignment device.

4. A method as claimed in claim 1, characterized in that use is made of a double mark which consists of said test mark and an associated alignment mark whose periodical structure of undivided strips and intermediate strips is equal to that of the test mark, and in that said alignment mark is used for aligning the test mark.

5. A method as claimed in claim 1, characterized in that use is made of a test mark having a plurality of parts, while the direction of the strips and intermediate strips of a part is perpendicular to the direction of the strips and intermediate strips of another part.

6. A method as claimed in claim 1, characterized in that use is made of a production mask which is provided with at least one test mark.

7. A method as claimed in claim 1, characterized in that use is made of a test mask which is provided with at least one test mark.

8. A method as claimed in claim 1, characterized in that a plurality of images of at least one test mark is formed in the photoresist, each time at a different focusing of the projection system, in that the photoresist is overexposed during multiple imaging of the test mark, and in that the optimum focusing of the projection system is determined from the signals which are obtained when detecting each of said images by means of the alignment device.

9. A method as claimed in claim 8, characterized in that the optimum focusing signal obtained via the test-mark image detection is compared with a focus-measuring signal obtained by means of a separate focus-measuring device and used for calibrating the last-mentioned device.

10. A method as claimed in claim 1, characterized in that an image of at least one test mark is formed in the photoresist, using a given illumination dose, in that the alignment signal offset associated with this illumination dose and determined by the asymmetry in the aligned test-mark image is determined, and in that it is checked in further measurements whether this offset is maintained.

11. A method as claimed in claim 1, characterized in that use is made of a test mask in which a plurality of test marks is provided, in that said test mask is imaged a number of times in different areas of the photoresist, each time at a different focusing of the projection system, in that the optimum focusing is determined for each test mark from the signals obtained when detecting each image associated with said test mark by means of the alignment device, and in that optical properties of the projection lens system are determined by comparing the optimum focusing values for the different test marks.

12. A method as claimed in claim 1, characterized in that a plurality of images having equal focusing values of at least one test mark is formed in different areas of the photoresist and in that the signals obtained when detecting the formed images by means of the alignment device are compared with each other.

13. A method as claimed in claim 12, characterized in that a plurality of images of the test mark, each time at a different focusing is formed in each of said areas, in that the optimum focusing value is determined for each of said areas and in that said optimum focusing values are compared with each other.

14. A test mask intended for use in the method as claimed in claim 1, provided with at least one test mark and at least one alignment mark, in which the alignment mark has a periodical structure of strips which are transparent to the projection beam radiation and alternate with opaque intermediate strips, characterized in that the test mark has a similar structure with the same period as that of the alignment mark and in that the strips of the test mark are partly non-transparent to the projection beam radiation and partly consist of sub-strips which are alternately transparent and opaque to said radiation.

15. A test mask as claimed in claim 14, characterized in that a separate alignment mark of said type is provided proximate to each test mark.

16. A test mask as claimed in claim 14, characterized in that in addition to a test mark in the centre, the mask also comprises a test mark in at least the four corners.

17. A test mask as claimed in claim 14, characterized in that each test mark is a grating having a periodical structure in two mutually perpendicular directions.

18. A test mask as claimed in claim 17, characterized in that each test mark is a grating which comprises a plurality of portions, in which the direction of the grating strips of one portion is perpendicular to the direction of the grating strips of a second portion.

19. A test mask as claimed in claim 14, characterized in that the strips of each test mark comprise three transparent and three opaque sub-strips.

20. A test mask as claimed in claim 14, characterized in that the sub-strips of a test mark have the same direction as the opaque intermediate strips of said test mark.

21. A test mask as claimed in claim 14, characterized in that the direction of the sub-strips of a test mark extends at an acute angle to the direction of the opaque intermediate strips of said test mark.

22. A test mask as claimed in claim 14, characterized in that the strips are wider than the intermediate strips.

23. A test mask as claimed in claim 14, characterized in that the testmark is elongated and consists of two parts, in which the grating strips of one part are perpendicular to those of the other part, and in that the testmark has such a width that its image fits in an intermediate area on the substrate, which is situated between two areas in which a production mask pattern is to be imaged.

24. A test mask for use in the method as claimed in claim 1, provided with at least one test mark and at least one alignment mark, in which the alignment mark has a periodical structure of strips which are transparent to the projection beam radiation and alternate with opaque intermediate strips, characterized in that the test mark has a similar structure and the same period as that of the alignment mark, and in that the test-mark strips consist of a first, transparent, part and a second, opaque, part in which transparent sub-micron areas are provided, said second part operating as a grey filter.

25. An apparatus for repetitively imaging a mask pattern, said apparatus comprising: a mask table for receiving thereon a mask having at least one test mark; a substrate table for receiving thereon a substrate having a radiation-sensitive layer; an illumination system for supplying a projection beam and a projection lens system for projecting the image of at least one test mark of the mask in the radiation-sensitive layer; an alignment device for aligning the mask with respect to the substrate, and a test-mark image detection device which is constituted by the alignment device, wherein the test mark strips are partly non-transmissive to the projection beam radiation and partly consist of a plurality of sub-strips which are alternately transmissive and non-transmissive to the projective beam radiation and wherein the test-mark image detection device is adapted to detect, during each latent-image detection cycle, the image of both a test mark and an associated alignment mark spaced apart therefrom at a defined distance, and means for determining the difference between the observed aligned positions of the two mark images.

26. An apparatus as claimed in claim 25, characterized in that the substrate table is coupled to a position detection device for detecting positions along at least two mutually perpendicular axes and rotations about these axes, and in that the output signals of the position detection device, of the image detection device, of the alignment device and of a focus error detection device are connected to the inputs of an electronic signal-processing device which supplies control signals for correcting one or more of the following parameters:

the wavelength of the projection beam the pressure within the projection lens holder the mutual distances between the lens elements of the projection lens system the composition of the medium in one or more of the compartments of the projection lens holder the temperature within the projection lens holder the zero setting of the alignment device the zero setting of the focusing device the magnification of the projection lens system.

* * * * *